United States Patent
Uehara

(10) Patent No.: US 7,817,249 B2
(45) Date of Patent: Oct. 19, 2010

(54) EXPOSURE METHOD AND APPARATUS, AND DEVICE PRODUCING METHOD USING TWO LIGHT BEAMS TO CORRECT NON-ROTATIONALLY SYMMETRIC ABERRATION

(75) Inventor: Yusaku Uehara, Saitama (JP)

(73) Assignee: Nikon Corporation, Tokyo (JP)

( * ) Notice: Subject to any disclaimer, the term of this patent is extended or adjusted under 35 U.S.C. 154(b) by 206 days.

(21) Appl. No.: 11/362,817

(22) Filed: Feb. 28, 2006

(65) Prior Publication Data
US 2006/0244940 A1    Nov. 2, 2006

Related U.S. Application Data

(63) Continuation of application No. PCT/JP2004/012215, filed on Aug. 25, 2004.

(30) Foreign Application Priority Data
Aug. 28, 2003 (JP) ............................. 2003-209211

(51) Int. Cl.
  *G03B 27/54*    (2006.01)
(52) U.S. Cl. .......................................... 355/70; 355/30
(58) Field of Classification Search .............. 355/68–70, 355/30, 53
See application file for complete search history.

(56) References Cited

U.S. PATENT DOCUMENTS

| | | | |
|---|---|---|---|
| 5,390,228 A | 2/1995 | Niibe et al. | |
| 5,610,684 A * | 3/1997 | Shiraishi | 355/55 |
| 5,805,273 A | 9/1998 | Unno | |
| 5,852,490 A * | 12/1998 | Matsuyama | 355/67 |
| 5,995,263 A | 11/1999 | Tokuda et al. | |
| 6,198,579 B1 | 3/2001 | Rupp | |
| 6,307,688 B1 | 10/2001 | Merz et al. | |
| 6,388,823 B1 | 5/2002 | Gaber et al. | |
| 6,466,382 B2 | 10/2002 | Muller-Rissmann et al. | |
| 6,504,597 B2 * | 1/2003 | Schuster et al. | 355/67 |
| 6,521,877 B1 | 2/2003 | Muller-Rissmann et al. | |
| 6,522,392 B1 | 2/2003 | Muller-Rissmann et al. | |
| 6,583,850 B2 | 6/2003 | Hummel et al. | |
| 6,603,530 B1 | 8/2003 | Kohno | |
| 6,781,668 B2 | 8/2004 | Schuster et al. | |
| 7,112,772 B2 * | 9/2006 | Wagner et al. | 250/201.9 |
| 2001/0019403 A1 | 9/2001 | Schuster et al. | |
| 2002/0008858 A1 | 1/2002 | Wagner et al. | |
| 2004/0144915 A1 | 7/2004 | Wagner et al. | |
| 2005/0018269 A1 * | 1/2005 | Weiss et al. | 359/212 |

FOREIGN PATENT DOCUMENTS

EP    0 823 662 A2    2/1998

(Continued)

*Primary Examiner*—Peter B Kim
*Assistant Examiner*—Chia-how Michael Liu
(74) *Attorney, Agent, or Firm*—Oliff & Berridge, PLC

(57) ABSTRACT

An exposure method which includes illuminating a first object formed with a pattern to be transferred with a first light beam to expose a second object with the first light beam through the first object and a projection optical system; and irradiating the first object and at least one portion of the projection optical system with a second light beam having a wavelength range that is different from that of the first light beam to correct image forming characteristics of the projection optical system.

41 Claims, 17 Drawing Sheets

FOREIGN PATENT DOCUMENTS

| | | |
|---|---|---|
| EP | 1 376 092 A2 | 1/2004 |
| EP | 1 376 185 A2 | 1/2004 |
| JP | A 08-008178 | 1/1996 |
| JP | A 08-045827 | 2/1996 |
| JP | A 09-232213 | 9/1997 |
| JP | A 10-050585 | 2/1998 |
| JP | A 10-064790 | 3/1998 |
| JP | A 10-256150 | 9/1998 |
| JP | A 2001-196305 | 7/2001 |
| WO | WO 03/017004 * | 2/2003 |
| WO | WO 03/017004 A2 | 2/2003 |

* cited by examiner

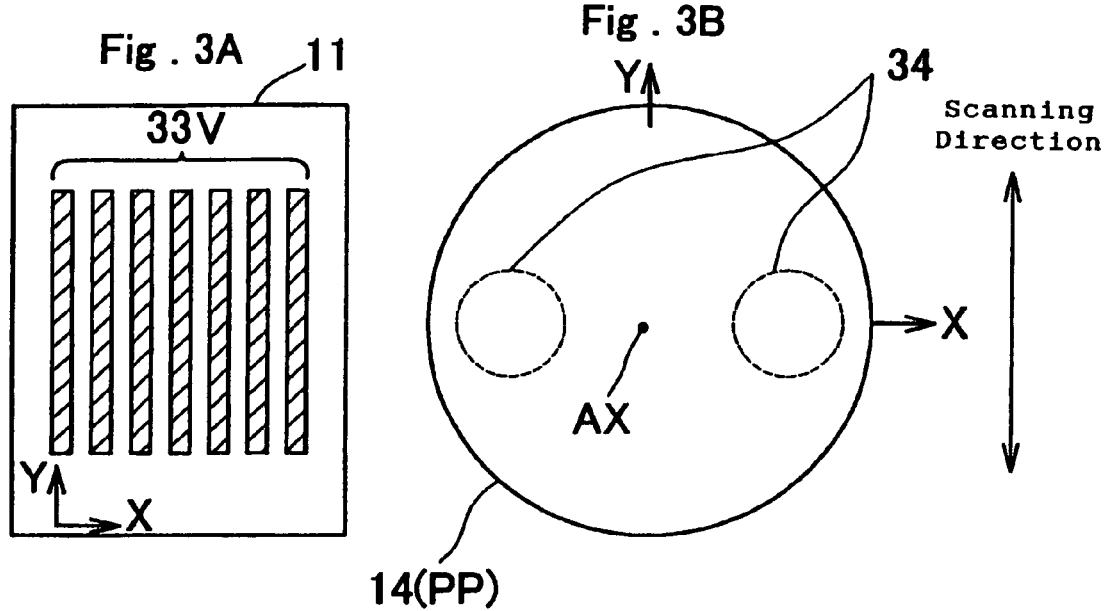
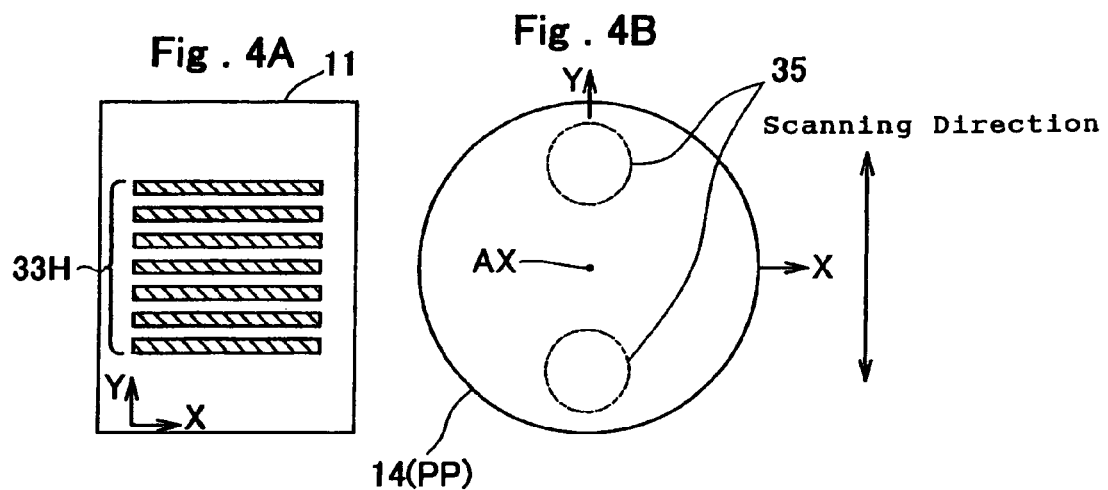

EXPOSURE METHOD AND APPARATUS, AND DEVICE PRODUCING METHOD USING TWO LIGHT BEAMS TO CORRECT NON-ROTATIONALLY SYMMETRIC ABERRATION

This is a Continuation of Application No. PCT/JP2004/012215 filed Aug. 25, 2004, which claims the benefit of Japanese Patent Application No. 2003-209211 filed Aug. 28, 2003. The entire disclosure of the prior applications is hereby incorporated by reference herein in its entirety.

TECHNICAL FIELD

The present invention relates to an exposure apparatus having a correcting mechanism of image forming characteristics used in a photolithography procedure for producing various devices such as a semiconductor device, a liquid crystal display and a thin film magnetic head for instance, and the invention also relates to an exposure method using the exposure apparatus. The exposure apparatus and the exposure method are suitably used when a mask pattern is exposed onto a substrate under a non-rotationally symmetrical illumination condition such as a so-called dipole illumination, or an illumination condition in which a light quantity distribution is largely varied in a radial direction such as small σ illumination.

BACKGROUND ART

When a semiconductor device or the like is to be produced, in order to transfer a pattern of a reticle as a mask to each shot region on a wafer (or glass plate or the like) as a substrate on which a photoresist is applied, a projection exposing apparatus such as a stepper is used. In the projection exposing apparatus, image forming characteristics of a projection optical system are gradually varied due to variation in exposure dose of exposure light and variation in ambient atmospheric pressure. Hence, in order to always maintain the image forming characteristics in a desired condition, the projection exposing apparatus includes an image forming characteristic correcting mechanism which corrects the image forming characteristics by controlling a position of a partial optical member constituting the projection optical system. Image forming characteristics that can be corrected by a conventional image forming characteristic correcting mechanism are rotationally symmetric low order elements such as distortion aberration and magnification.

In order to enhance resolution of specific pattern, exposing apparatuses of recent years use, in some cases, illumination conditions in which exposure light does not pass through a region which includes an optical axis on a pupil plane of the illumination optical system. Examples of such illumination conditions are a so-called zone illumination method and a four-pole illumination method (illumination method using four regions on a pupil plane of the illumination optical system as secondary light sources). In this case, optical members in the projection optical system which are close to the pupil plane are illuminated with exposure light except their central portion areas. In order to increase an area of a pattern which can be transferred without increasing the projection optical system in size, a scanning exposing type projection exposing apparatus such as a scanning stepper is also frequently used recently. In the case of the scanning exposing type, a reticle is illuminated with light in a rectangular illumination region whose scanning direction is equal to its short side direction. Therefore, in the case of optical members in the projection optical system which are close to a reticle and wafer, regions thereof which are non-rotationally symmetric are mainly illuminated with exposure light.

In such an exposing apparatus, there is an adverse possibility that a high order component such as a high order spherical aberration in the image forming characteristics of the projection optical system is varied or non-rotationally symmetric aberration is varied. Hence, there is proposed a projection exposing apparatus which can suppress such variations (see patent documents 1 and 2 for example).

[Patent document 1] Japanese Patent Application Laid-open Publication No. H10-64790

[Patent document 2] Japanese Patent Application Laid-open Publication No. H10-50585

DISCLOSURE OF THE INVENTION

Recently, when a reticle pattern mainly including a predetermined line and space pattern is to be transferred, a dipole illumination method using, as secondary light source, only two regions which sandwich an optical axis on a pupil plane of an illumination optical system is used in some cases. This dipole illumination is non-rotationally symmetric and has light quantity distribution greater than that of the four-pole illumination. Therefore, astigmatic aberration on the optical axis (hereafter referred to "center astigmatism") which is non-rotationally symmetric aberration component is generated on a projection image. Non-rotationally symmetric aberration other than the astigmatic aberration is also varied by the dipole illumination.

When only a region of one end of a rectangular illumination region on a reticle is illuminated with exposure light, in optical members of the projection optical system on the side of a reticle and on the side of a wafer, light quantity distribution of exposure light largely becomes non-rotationally symmetric. Therefore, many non-rotationally symmetric aberrations are generated. Similarly, also when pattern density of reticles is especially low in a specific region, light quantity distribution of exposure light largely becomes non-rotationally symmetric in optical members of the projection optical system on the side of the reticle and on the side of the wafer. Therefore, non-rotationally symmetric aberrations are generated.

Further, there is used an illumination condition in which light quantity distribution of exposure light in a radial direction is largely varied like small C illumination (illumination method in which a region near an optical axis of an illumination optical system on a pupil plane is used as a secondary light source). In this case also, variation of image forming characteristics which can not easily be corrected by a conventional image forming characteristic correcting mechanism is generated like variation of high order spherical aberration in some cases. Thus, it is desired to take any measures.

In view of the above circumstances, it is an object of the present invention to provide an exposing technique capable of maintaining image forming characteristics in an excellent state.

It is another object of the invention to provide an exposing technique capable of efficiently controlling a non-rotationally symmetric component or a high order component among image forming characteristics when a light quantity distribution of exposure light which passes through a mask and at least a portion of a projection optical system becomes non-rotationally symmetric or when a Light quantity distribution is largely varied in a radial direction.

It is another object of the invention to provide an exposing technique capable of suppressing image forming characteristics from varying.

The present inventions for solving the above problems areas follows. Note that symbols inside the parentheses added to various elements correspond to structures in a later-described embodiment, the elements are described as examples and the invention is not limited to the elements.

An exposure method according to the present invention is an exposure method which illuminates a first object formed with a pattern to be transferred with a first light beam to expose a second object with the first light beam through the first object and a projection optical system, wherein the first object and at least one portion of the projection optical system are irradiated with a second light beam having a wavelength range that is different from that of the first light beam to correct image forming characteristics of the projection optical system.

According to the present invention, it is possible to maintain the image forming characteristics of the projection optical system in an excellent state. Also when the first object is illuminated with the first light beam under a non-rotationally symmetric illumination condition such as the dipole illumination, or under an illumination condition in which the light quantity distribution is largely varied in the radial direction on a pupil plane of an illumination optical system such as the small σ illumination, and a non-rotationally symmetric aberration or a rotationally symmetric high order aberration is generated, such an aberration can efficiently be controlled.

In this invention, when the first object and the at least one portion of the projection optical system are illuminated with the first light beam at a non-rotationally symmetric light quantity distribution, it is preferable to apply the second light beam such that the non-rotationally symmetric aberration of the projection optical system generated by the illumination of the first light beam is corrected. With this, it is possible to suppress the non-rotationally symmetric aberration.

In this case, more concretely, two regions which are substantially symmetric in a first direction with respect to a predetermined optical member in the vicinity of a pupil plane of the projection optical system are irradiated with the first light beam, it is preferable that two regions which are substantially symmetric in a second direction perpendicular to the first direction with respect to the optical member are irradiated with the second light beam. With this, since the predetermined optical member is illuminated at a substantially rotationally symmetric light quantity distribution (or heat quantity distribution), the non-rotationally symmetric aberration is suppressed.

An optical member illuminated with the first light beam at the non-rotationally symmetric light quantity distribution and an optical member irradiated with the second light beam may be different from each other. The non-rotationally symmetric aberration may be converted into a rotationally symmetric aberration by the irradiation of the second light beam. It is preferable to correct the rotationally symmetric aberration of the projection optical system generated by the irradiation of the second light beam. Since a normal rotationally symmetric aberration can easily be corrected, variation in image forming characteristics can easily be suppressed.

It is also possible to apply the second light beam in accordance with an exposure dose of the first light beam. In this case, it is easy to control the application. A generation amount of a non-rotationally symmetric aberration based on the exposure dose of the first light beam may be calculated, and the second light beam may be applied based on this calculation result. When the first and second light beams are pulsed light, the second light beam may be applied in synchronism with light emitting timing of the first light beam.

The second light beam may be applied such as to cancel a non-rotationally symmetric aberration generated by irradiation of the first light beam.

Temperature variation of the first object and a member of the at least one portion of the projection optical system caused by illumination of the first light beam may be monitored, and the second light beam may be applied based on a result of the monitoring. With this, it is possible to correct a non-rotationally symmetric aberration and the like with a simple control.

It is possible to measure the non-rotationally symmetric aberration of the projection optical system, and to apply the second light beam based on a result of the measurement.

It is possible to apply the second light beam such that the non-rotationally symmetric aberration generated when illumination conditions by the first light beam are switched is canceled out.

When the non-rotationally symmetric aberration remains even if the second light beam is applied, it is preferable to adjust an exposing condition in accordance with an aberration in a direction in which more precision exposure is required. If an exposing condition is adjusted in accordance with a pattern which is required to be exposed precisely, it is possible to reduce influence of a remaining aberration.

It is preferable to monitor a light quantity of the second light beam immediately before a portion which is irradiated with the second light beam, and to control an exposure dose of the second light beam based on a result of the monitoring. With this, the exposure dose of the second light beam can precisely be controlled.

In the present invention, the second light beam may be applied such that a non-rotationally symmetric aberration generated by variation in ambient atmospheric pressure or temperature of the projection optical system is canceled out, or such that a static non-rotationally symmetric aberration remained by the adjustment of the projection optical system is canceled out, or such that a non-rotationally symmetric aberration generated by a density distribution of the pattern of the first object is canceled out.

It is possible to stop irradiation of the second light beam in a period during which the illumination of the first light beam is not carried out.

In the present invention, as one example, a predetermined optical member is irradiated with the second light beam, and 90% or more energy is absorbed by the optical member. With this, only the predetermined optical member can efficiently be heated. A carbon dioxide laser beam can be used as the second light, for example.

A device producing method of the present invention includes a step of transferring a pattern of a device onto an object using the exposing method of the present invention. Since a fine pattern of a device can precisely be transferred with a small aberration by applying the invention, a device having high packing density can be produced precisely.

Next, an exposure apparatus of the present invention is an exposure apparatus which illuminates a first object formed with a pattern to be transferred with a first light beam to expose a second object with the first light beam through the first object and a projection optical system, wherein the exposure apparatus comprises an irradiation mechanism which irradiates the first object and at least one portion of the projection optical system with second light beam having a wavelength range different from that of the first light beam.

According to the invention, the image forming characteristics of the projection optical system can be maintained in an excellent state. Also when a non-rotationally symmetric aberration or a rotationally symmetric high order aberration is generated by their radiation of the first light beam, the aberration can be efficiently controlled.

In the present invention, when the first object and the at least one portion of the projection optical system are illuminated with the first light beam at a non-rotationally symmetric light quantity distribution, it is preferable that the exposure apparatus further includes a control apparatus which apply the second light beam through the irradiation mechanism such that the non-rotationally symmetric aberration of the projection optical system generated by the irradiation of the first light beam is corrected.

When two regions which are substantially symmetric in a first direction with respect to a predetermined optical member in the vicinity of a pupil plane of the projection optical system are irradiated with the first light beam, it is preferable that the irradiation mechanism directs the second light beam to two regions which are substantially symmetric in a second direction perpendicular to the first direction of the optical member.

It is preferable that the apparatus further includes an aberration correcting mechanism which corrects a rotationally symmetric aberration of the projection optical system, and the control apparatus controls operations of the irradiation mechanism and the aberration correcting mechanism to correct the aberration of the projection optical system. With this, it is possible to correct both of the non-rotationally symmetric aberration and the rotationally symmetric aberration.

It is preferable that the apparatus further includes a first photoelectric sensor which monitors an exposure dose of the first light beam, and the control apparatus controls an exposure dose of the second light beam through the irradiation mechanism based on a result of detection of the first photoelectric sensor.

It is preferable that the apparatus further includes a temperature sensor which measures temperatures of the first object and the at least one portion of the projection optical system, and the control apparatus allows the irradiation mechanism to apply the second light beam based on a result of detection of the temperature sensor.

It is preferable that the apparatus further includes a second photoelectric sensor which monitors light quantity of second light beam immediately before a portion is irradiated with the second light beam, and the control apparatus controls an exposure dose of the second light beam based on a result of detection of the second photoelectric sensor.

The exposure apparatus may further includes an environment sensor which measures an environment condition including ambient atmospheric pressure and temperature of the projection optical system, and the second light beam may be applied based on a result of measurement of the environment sensor.

It is preferable that the exposure apparatus includes a determining apparatus which stops irradiation of the second light beam in a period during which the illumination of the first light beam is not carried out.

It is preferable that a barrel which holds the projection optical system includes an opening for guiding the second light beam. It is preferable that the barrel includes a flange portion which supports the barrel, and the opening is provided in the flange portion or in the vicinity of the flange portion. A carbon dioxide laser beam can be used as the second light, for example.

Another producing method of a device according to the present invention includes a step of transferring a pattern of a device onto an object using the exposing apparatus of the present invention.

According to the invention, the image forming characteristics can be maintained in an excellent state. It is possible to efficiently suppress a non-rotationally symmetric component or a high order component of the image forming characteristics also when a light quantity distribution of the first light beam (exposure light) which passes through the first object (mask) and at least a portion of the projection optical system becomes non-rotationally symmetric or is largely varied in a radial direction.

According to the producing method of the device of the present invention, a device having high packing density can be produced precisely with high throughput. Since the image forming characteristics can always be maintained in an excellent state even if dipole illumination or small σ illumination is used, a device having high packing density can be produced precisely with high throughput.

BRIEF DESCRIPTION OF THE FIGURES IN THE DRAWINGS

FIG. 3A is a diagram showing an L&S pattern in an X direction, and FIG. 3B is a diagram showing a light quantity distribution on a pupil plane of a projection optical system at the time of dipole illumination in the X direction;

FIG. 4A is a diagram showing an L&S pattern in an Y direction, and FIG. 4B is a diagram showing a light quantity distribution on a pupil plane of a projection optical system at the time of dipole illumination in the Y direction;

One example of preferred embodiment of the present invention will be explained with reference to the drawings. In this example, the present invention is applied to a step and scan type scanning exposing projection exposing apparatus.

Figure 1:
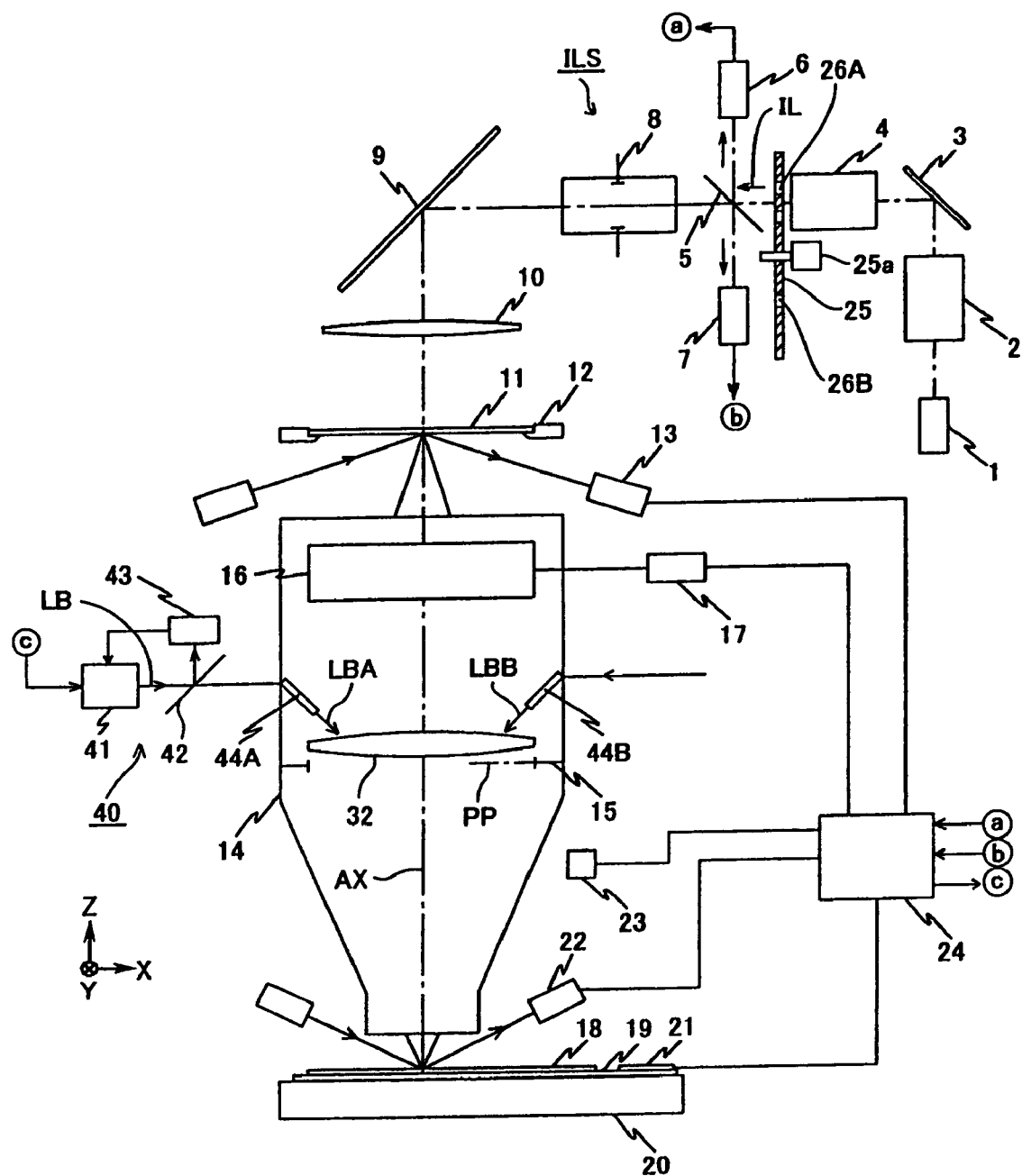
FIG. 1 is a partially cutaway view showing a schematic structure of one example of a projection exposing apparatus according to an embodiment of the present invention.

FIG. 1 shows a schematic structure of the projection exposing apparatus of this embodiment. In FIG. 1, a KrF excimer laser beam source refraction element of 247 nm) is used as an exposure light source 1. An ultraviolet laser beam source such as an ArF excimer laser beam source refraction element of 193 nm), an $F_2$ laser beam source refraction element of 157 nm), a $Kr_2$ laser beam source refraction element of 146 nm), and an $Ar_2$ laser beam source refraction element of 126 nm), a harmonic generating light source of YAG laser, a harmonic generating apparatus such as a solid laser (semiconductor laser), or a mercury lamp (i line or the like) can be used as the exposure light source.

A cross section of exposure light IL as a first light beam (exposure beam) pulse-emitted from the exposure light source 1 at the time of exposure is shaped into a predetermined shape through a beam shaping optical system (not shown), the exposure light IL enters a first flyeye lens 2 as an optical integrator (uniformizer or homogenizer), and its illumination distribution is uniformized. The exposure light IL ejected from the first flyeye lens 2 enters a second flyeye lens 4 as an optical integrator through a relay lens (not shown) and a vibration mirror 3, and its illumination distribution is further uniformized. The vibration mirror 3 is used for reducing speckle of exposure light IL which is laser beam, and for reducing interference fringes caused by a flyeye lens. It is also possible to use a diffractive optical element (DOE) and an inner surface reflection type integrator (rod lens or the like) instead of the flyeye lenses 2 and 4.

An illumination system opening stop member 25 is disposed on a focal plane (pupil plane of illumination optical system ILS) on the ejection side of the second flyeye lens 4 such that the illumination system opening stop member 25 can rotate by a drive motor 25a. The illumination system opening stop member 25 set a light quantity distribution (secondary light source) of exposure light to any one of a small circle (small σ illumination), a normal circle, a plurality of eccentric regions (dipole and four-pole illumination) and a zone shape, thereby determining an illumination condition. A main control system 24 collectively controls operations of the entire apparatus. The main control system 24 comprises a computer. The main control system 24 controls a rotation angle of the illumination system opening stop member 25 through the drive motor 25a, thereby setting the illumination condition. The illumination system opening stop member 25 includes a plurality of opening stops (σ stops). In a state shown in FIG. 1, of the plurality of opening stops, an opening stop 26A for the first dipole illumination (dipole illumination) having two circular openings formed symmetrically with respect to the optical axis, and an opening stop 26B for the second dipole illumination appear. The opening stop 26B has a shape obtained by rotating the opening stop 26A through 90°. The opening stop 26A for the first dipole illumination is disposed on the flange portion on the ejection side of the second flyeye lens 4.

In this example, a light quantity distribution on the pupil plane of the illumination optical system ILS is adjusted using the illumination system opening stop member 25. It is also possible to adjust the light quantity distribution on the pupil plane of the illumination optical system ILS using another optical system as disclosed in U.S. Pat. No. 6,563,567. Disclosure thereof is incorporated in this specification under the laws of countries designated or selected in this international application.

Exposure light IL which passed the opening stop 26A in the illumination system opening stop member 25 enters a beam splitter 5 having a small reflection factor, and exposure light reflected by the beam splitter 5 is received by an integrator sensor 6 as a first photoelectric sensor through a converging lens (not shown) A detection signal of the integrator sensor 6 is supplied to an exposure quantity controller and an image forming characteristic calculator in the main control system 24. The exposure quantity controller indirectly calculates exposure energy on a wafer 14 using the detection signal and transmittancy of the optical system from previously measured beam splitter 5 to a wafer 18 as a substrate. The exposure quantity controller controls output of the exposure light source 1 such that integrated exposure energy on the wafer 14 falls within a target range, and controls pulse energy of the exposure light IL in stages using a dimmer mechanism (not shown) as required.

Exposure light IL which passed the beam splitter 5 reaches an opening of the field stop 8 through a relay lens (not shown). The field stop 8 actually comprises a fixed field stop (fixed blind) and a movable field stop (movable blind). The movable field stop is disposed on a plane which is in substantially a conjugate relation with respect to a pattern face (reticle plane) of the reticle 11 as a mask, and the fixed field stop is disposed on a plane slightly defocused from a plane which is in a conjugate relation with respect to the reticle plane. The fixed field stop is used for defining a shape of an illumination region on the reticle 11. The movable field stop is used for closing the illumination region in a scanning direction so that unnecessary portion is not exposed to light when the scanning exposure of each shot region to be exposed is started and completed. The movable field stop is also used for defining a center and a width in a non-scanning direction of the illumination region as required.

Figure 18:
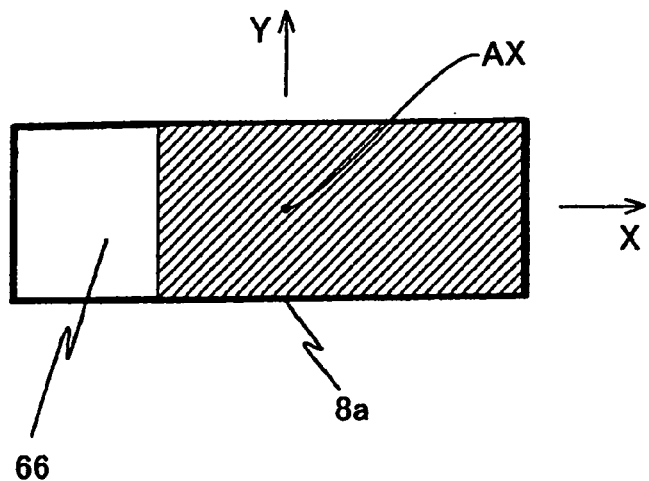
FIG. 18 is a diagram showing an opening when only an end region of an opening of a field stop.

An illumination region of a pattern face (lower face) of a reticle 11 as a mask is illuminated with exposure light IL which passed the opening of the field stop 8 at uniform illumination distribution through a condensing lens, an optical path bending mirror 9 and a condensing lens 10. A normal shape of the opening of the field stop 8 (here, the fixed field stop) is a rectangular shape having a ratio of vertical length and lateral length of about 1:3 to 1:4 as can be seen in the opening 8a shown in FIG. 18. A normal shape of an illumination region on the reticle 11 which is in substantially a conjugate relation with the opening 8a is also rectangular as can be seen in an illumination region 8aR shown in FIG. 19.

Referring to FIG. 1 again, under the exposure light IL, a pattern in the illumination region of the reticle 11 is projected onto an exposure region on one shot region on the wafer 18 on which photoresist is applied with a projection magnification β (β is ¼, ⅕ or the like) through a Bi-telecentric projection optical system 14. The exposure region is of rectangular shape which is conjugate with the illumination region on the reticle 11 with respect to the projection optical system 14. The reticle 11 and the wafer 18 respectively correspond to the first object and the second object. The wafer 18 is a disc-like substrate such as a semiconductor (silicon or the like) or an SOI (silicon on insulator) having a diameter of about 200 to 300 mm.

A portion of the exposure light IL is reflected from the wafer 18, the reflection light returns to the beam splitter 5 through the projection optical system 14, the reticle 11, the condensing lens 10, the mirror 9 and the field stop 8, and light further reflected by the beam splitter 5 is received by a reflection amount sensor (reflection factor monitor) 7 as the first photoelectric sensor through a converging lens (not shown). A detection signal of the reflection amount sensor 7 is supplied to the image forming characteristic calculator in the main control system 24. The image forming characteristic calculator calculates integrated energy of exposure light IL which enters the projection optical system 14 from the reticle 11 and integrated energy of exposure light IL which is reflected from the wafer 18 and returns to the projection optical system 14, using detection signals of the integrator sensor 6 and the reflection amount sensor 7. Information of the illumination condition (kinds of illumination system opening stop) during exposure is also supplied to the image forming characteristic calculator. An environment sensor 23 for measuring atmospheric pressure and temperature is disposed outside of the projection optical system 14. Measurement data of the environment sensor 23 is supplied to the image forming characteristic calculator also. The image forming characteristic calculator in the main control system 24 calculates a variation amount of rotationally symmetric aberration component and a variation amount of a non-rotationally symmetric aberration in the image forming characteristics of the projection optical system 14 using information such as illumination condition, integrated energy of exposure light IL, ambient atmospheric pressure and temperature. In image forming characteristic controller is also provided in the main control system 24. The image forming characteristic controller suppresses the variation amount of the image forming characteristics such that desired image forming characteristics can always be obtained in accordance with a result of calculation of the variation amount of the aberration component (details thereof will be described later).

The illumination optical system ILS comprises the exposure light source 1, the first flyeye lenses 2 and 4, the mirror 3 and 9, the illumination system opening stop member 25, the field stop 8, the condensing lens 10 and the like. The illumination optical system ILS is covered with a sub-chamber (not shown) as a sealed chamber. In order to maintain the transmittancy with respect to the exposure light IL at high level, dry air from which impurities are removed at high level (nitrogen gas, helium gas or the like is also used when the exposure light is ArF excimer later) is supplied into the sub-chamber and a barrel of the projection optical system 14.

The projection optical system 14 of this example is a refraction system. A plurality of optical members constituting the projection optical system 14 includes a plurality of lenses made of quartz (Fluorspar or the like is also used when the exposure light is ArF excimer laser) which is rotationally symmetric with respect to the optical axis AX, and the optical members also includes a flat plate-like quartz aberration correction plate. An opening stop 15 is disposed on a pupil plane PP (plane which in conjugate with respect to the pupil plane of the illumination optical system ILS) of the projection optical system 14. A lens 32 as a predetermined optical member is disposed near the pupil plane PP. The lens 32 is irradiated with illumination light (second light beam) for correcting a non-rotationally symmetric aberration of wavelength range different from that of the exposure light IL. The image forming characteristic correcting mechanism 16 for correcting the rotationally symmetric aberration is incorporated in the projection optical system 14. The image forming characteristic controller in the main control system 24 controls the operation of the image forming characteristic correcting mechanism 16 through the controller 17.

Figure 2:
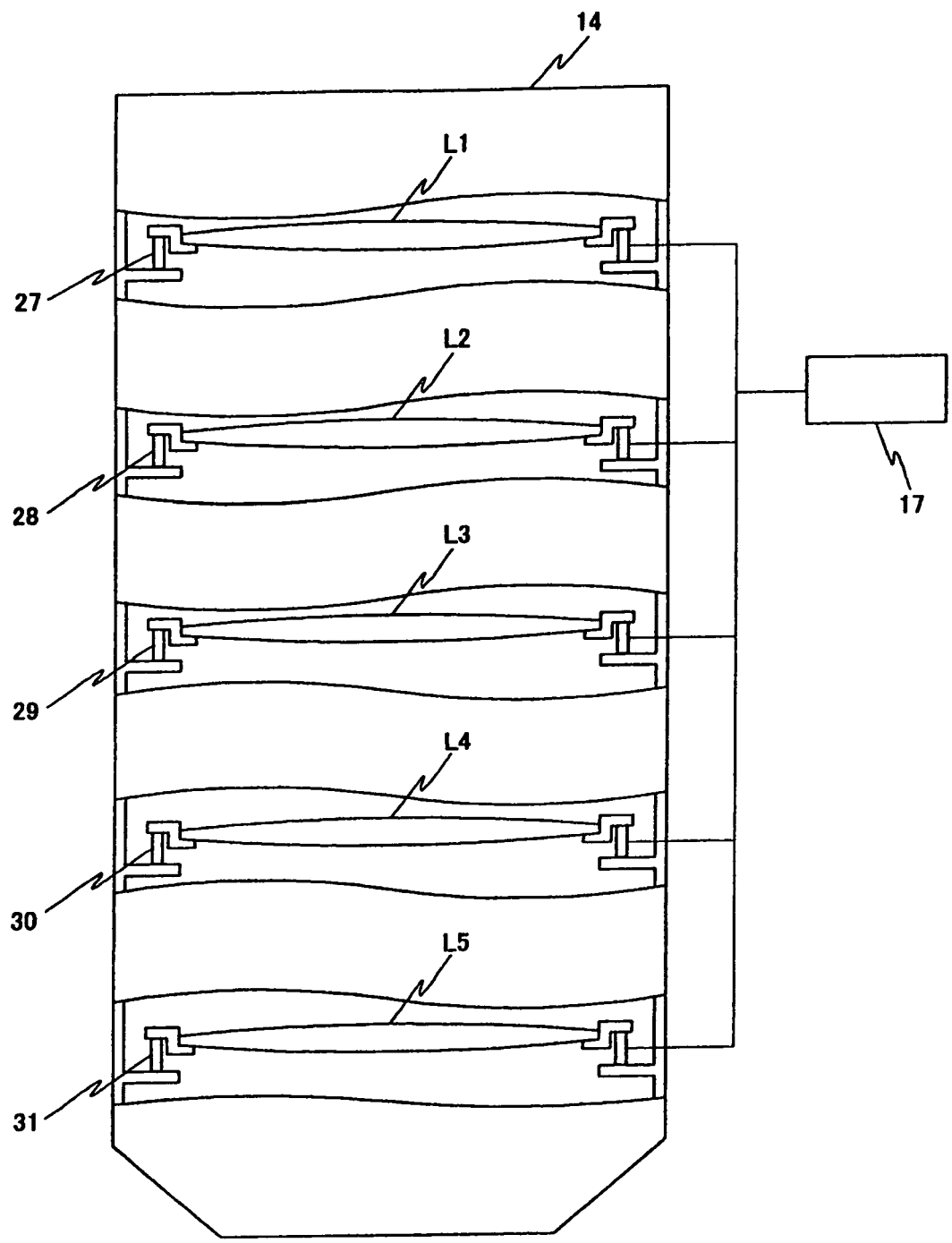
FIG. 2 is a partially cutaway view showing an example of a structure of an image forming characteristic correcting mechanism 16 shown in FIG. 1.

FIG. 2 shows one example of the image forming characteristic correcting mechanism 16 (aberration correcting mechanism) shown in FIG. 1. In FIG. 2, five lenses L1, L2, L3, L4 and L5 selected from the plurality of optical members are held in the barrel of the projection optical system 14 through drive elements 27, 28, 29, 30 and 31. These drive elements can expand and contract independently in directions of three optical axes. A lens and an aberration correction plate (not shown) are disposed in front of and behind the lenses L1 to L5. In this case, the three drive elements 27 (two of them can be seen in FIG. 2) are disposed in such a positional relation that the three drive elements assume apices of a regular triangle. Similarly, the drive elements 28 to 31 (three each) are also respectively disposed in such a positional relation that the three drive elements assume apices of a regular triangle. A piezo element such as a piezoelectric element, a magnetostrictor, or an electric micrometer can be used as each of the elastic drive elements 27 to 31. The controller 17 independently controls the expansion and contraction amounts of the drive elements 27 to 31 (three each) based on control information from the image forming characteristic controller in the main control system 24 with this control, it is possible to independently control positions of the five lenses L1 to L5 in the directions of the respective optical axes, and inclination angle around intersecting two axes which are perpendicular to the optical axis. With this, a predetermined rotationally symmetric aberration in the image forming characteristics of the projection optical system 14 can be corrected.

It is possible to correct a distortion aberration (including magnification error) by controlling position and inclination angle in the direction of the optical axis of the lens L1 or L5 close to the reticle or wafer. A spherical aberration can be corrected by correcting a position in the direction of the optical axis of the lens L3 close to the pupil plane of the projection optical system 14. The lens L3 to be driven in FIG. 2 may be the same as the lens 32 irradiated with aberration correction illumination light in the projection optical system 14 shown in FIG. 1. A mechanism for driving a lens or the like in the projection optical system 14 is also disclosed in Japanese Patent Application Laid-open No. H4-134813. It is also possible to control a position in the direction of the optical axis of the reticle 11 in FIG. 1, thereby correcting a predetermined rotationally symmetric aberration, instead of or together with the optical member in the projection optical system 14. Further, a mechanism which controls pressure of gas in a sealed space between predetermined two lenses in the projection optical system 14 may be used as the image forming characteristic correcting mechanism 16 shown in FIG. 1 as disclosed in Japanese Patent Application Laid-open No. S60-78454.

Referring to FIG. 1 again, in the following explanation, a Z axis is in parallel with an optical axis AX of the projection optical system 14, a Y axis is in a scanning direction of the reticle 11 and the wafer 18 at the time of scanning exposure on a plane perpendicular to the Z axis, and an X axis is in a non-scanning direction intersecting with the scanning direction.

First, the reticle 11 is adsorbed and held on to the reticle stage 12. The reticle stage 12 moves at a constant speed on a reticle base (not shown) in the Y direction, and finely moves in the X direction, Y direction and the rotation direction such as to correct a synchronization error, thereby scanning the reticle 11. Positions and rotation angles of the reticle stage 12 in the X direction and Y direction are measured by a moving mirror (not shown) and a laser interferometer (not shown) provided on the reticle stage 12, and the measured values are supplied to the stage controller in the main control system 24. The stage controller controls the position and speed of the reticle stage 12 based on the measured value and various control information. An oblique incidence mode automatic focusing sensor ("reticle-side AF sensor", hereinafter) 13 is disposed on an upper side surface of the projection optical system 14. The reticle-side AF sensor 13 obliquely projects a slit image on a pattern face (reticle plane) of the reticle 11, receives reflection light from the reticle plane to again form an image of the slit image, and detects displacement of the reticle plane in the Z direction from a lateral deviation amount of the slit image. Information detected by the reticle-side AF sensor 13 is supplied to the Z tilt stage controller in the main control system 24. A reticle alignment microscope (not shown) for aligning the reticle is disposed above the peripheries of the reticle 11.

The wafer 18 is adsorbed and held onto a Z tilt stage 19 through a wafer holder (not shown). The Z tilt stage 19 is fixed on a wafer stage 20. The wafer stage 20 moves in the Y direction on a wafer base (not shown) at a constant speed, and moves in the X direction and Y direction in stages. The Z tilt stage 19 controls the position of the wafer 18 in the Z direction and the inclination angle around the Z axis and Y axis. A laser interferometer (not shown) measures the position of the wafer stage 20 in the X direction and Y direction and the rotation angle of the wafer stage 20, and the measured values are supplied to a stage controller in the main control system 24. The stage controller controls the position and speed of the wafer stage 20 based on the measured values and various control information. An oblique incidence mode automatic focusing sensor ("wafer-side AF sensor", hereinafter) 22 is disposed on a lower side surface of the projection optical system 14. The wafer-side AF sensor 22 obliquely projects a plurality of slit images on a surface of the wafer 18 (wafer face), receives light reflected from the wafer face to again form the slit images, and detects displacement (defocus amount) of the wafer face in the Z direction and an inclination angle of the wafer face from a lateral deviated amount of the slit images. Detection information of the wafer-side AF sensor 22 is supplied to the Z tilt stage controller in the main control system 24. The Z tilt stage controller drives the Z tilt stage 19 in an automatic focusing manner such that the wafer face is always brought into focus on an image plane of the projection optical system 14 based on detection information of each of the reticle-side AF sensor 13 and wafer-side AF sensor 22.

An exposure dose sensor 21 is fixed to the Z tilt stage 19 in the vicinity of the wafer 18. The exposure dose sensor 21 comprises a photoelectric sensor having a light receiving surface for covering the entire exposure-region of the exposure light IL. A detection signal of the exposure dose sensor 21 is supplied to the exposure quantity controller in the main control system 24. In a state where the light receiving surface of the exposure dose sensor 21 moves to an exposure region of the projection optical system 14 before exposure is started or periodically, and a detection signal of the integrator sensor 6 is subtracted from a detection signal of the exposure dose sensor 21. With this, the exposure quantity controller calculates and stores transmittancy of the optical system from the beam splitter 5 to the exposure dose sensor 21 (wafer 18).

An off-axis mode alignment sensor (not shown) is disposed above the wafer stage 20. The main control system 24 aligns the reticle 11 and the wafer 18 based on detection results of the reticle alignment microscope and its alignment sensor. When exposure is to be carried out, the illumination region on the reticle 11 is irradiated with the exposure light IL and in this state, operation for driving the reticle stage 12 and the wafer stage 20 and synchronously scanning the reticle 11 and one shot region on the wafer 18 in the Y direction, and operation for driving the wafer stage 20 and moving the wafer 18 in the X direction and Y direction in stages are repeated. With this, a pattern image of the reticle 11 is exposed on each shot region on the wafer 18 in a step and scan manner.

In this example, the opening stop 26A having two openings are disposed on the pupil plane of the illumination optical system ILS shown in FIG. 1 for carrying out the dipole illumination. The two openings are separated in a direction corresponding to the X direction. In this case, main transferring patterns formed on the reticle 11 are line and space patterns ("L&S pattern" hereinafter) 33V arranged in the X direction as shown in FIG. 3A in an enlarged scale as one example. In the L&S patterns 33V, thin and long line patterns extending in the Y direction are arranged in the X direction (non-scanning direction) with a small pitch substantially close to resolution limit of the projection optical system 14. At that time, a plurality of other L&S patterns are formed on the reticle 11 such that they are arranged in the X direction and Y direction (scanning direction) at a larger pitch than the L&S pattern 33V.

According to the dipole illumination in the X direction using the opening stop 26A as in this example, if there is no reticle, as shown in FIG. 3B, two circular regions 34 which are symmetric in the X direction with respect to the optical axis AX are illuminated with exposure light IL on the pupil plane PP of the projection optical system 14. When various reticle patterns are arranged on the optical path of the exposure light IL also, the light quantity of zero order light is much greater than light quantity of diffraction light and diffraction angle is small. Therefore, most of exposure light IL (image forming ray bundle) pass the circular region 34 or in the vicinity thereof. When the reticle 11 shown in FIG. 3A is disposed in the optical path of the exposure light IL as in this example, ±1st order diffraction light from L&S patterns 33V of pitch close to the resolution limit also pass through the substantially circular region 34 or in the vicinity thereof. Therefore, images of the L&S patterns 33V can be projected on the wafer at high resolution.

Figure 5:
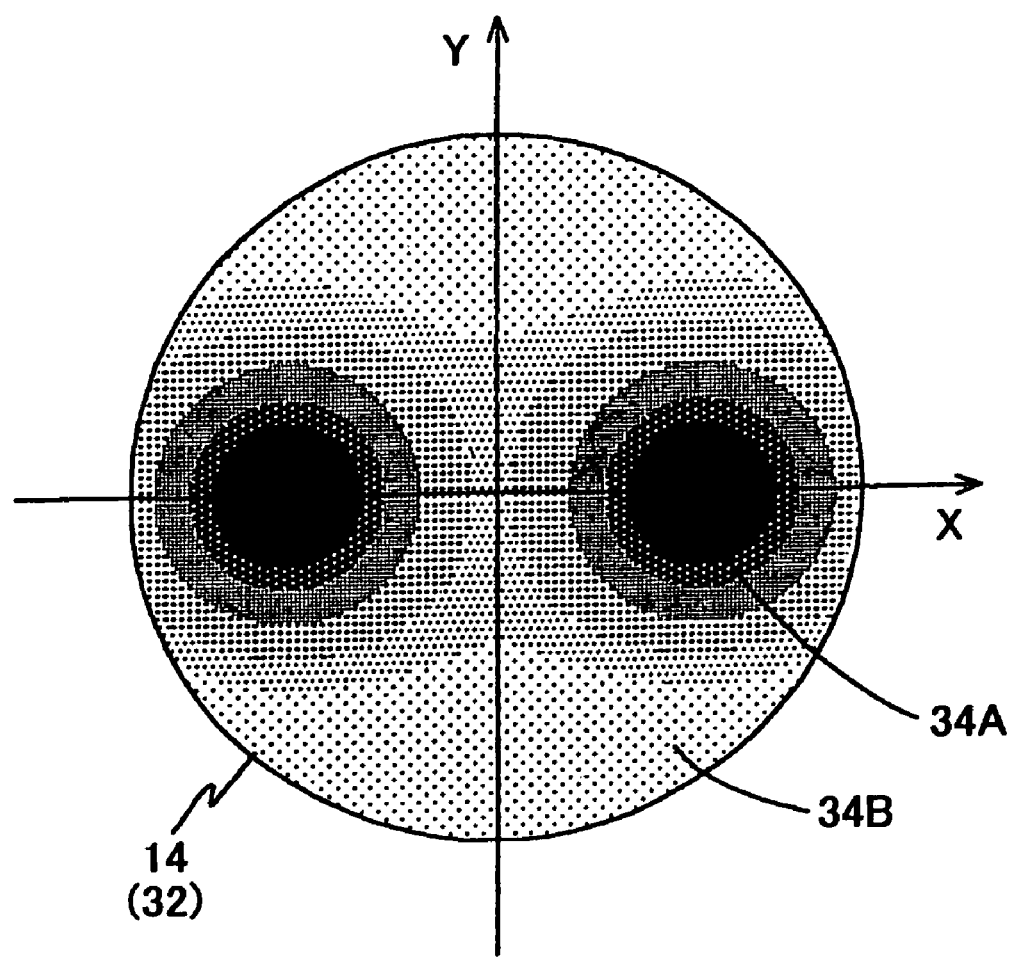
FIG. 5 is a diagram showing a temperature distribution of a lens at the time of dipole illumination in the X direction.
Figure 7:
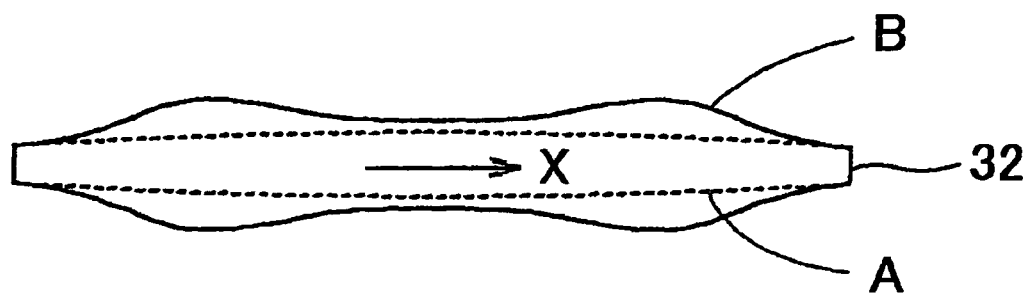
FIG. 7 is a side view along an X axis showing shape variation of the lens at the time of dipole illumination in the X direction.
Figure 8:
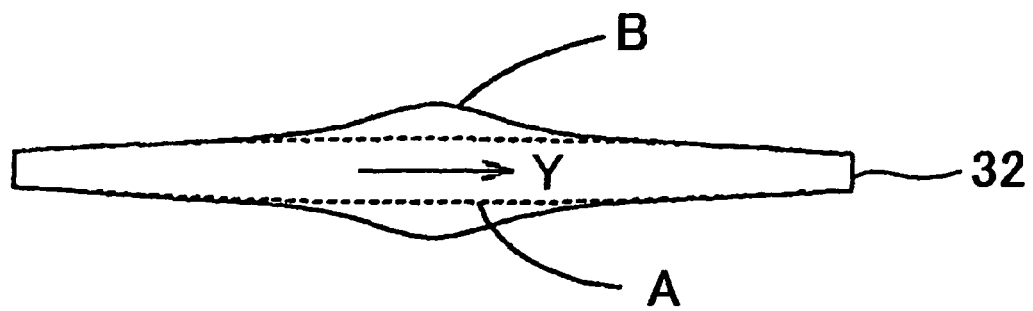
FIG. 8 is a side view along a Y axis showing shape variation of the lens at the time of dipole illumination in the X direction.
Figure 9:
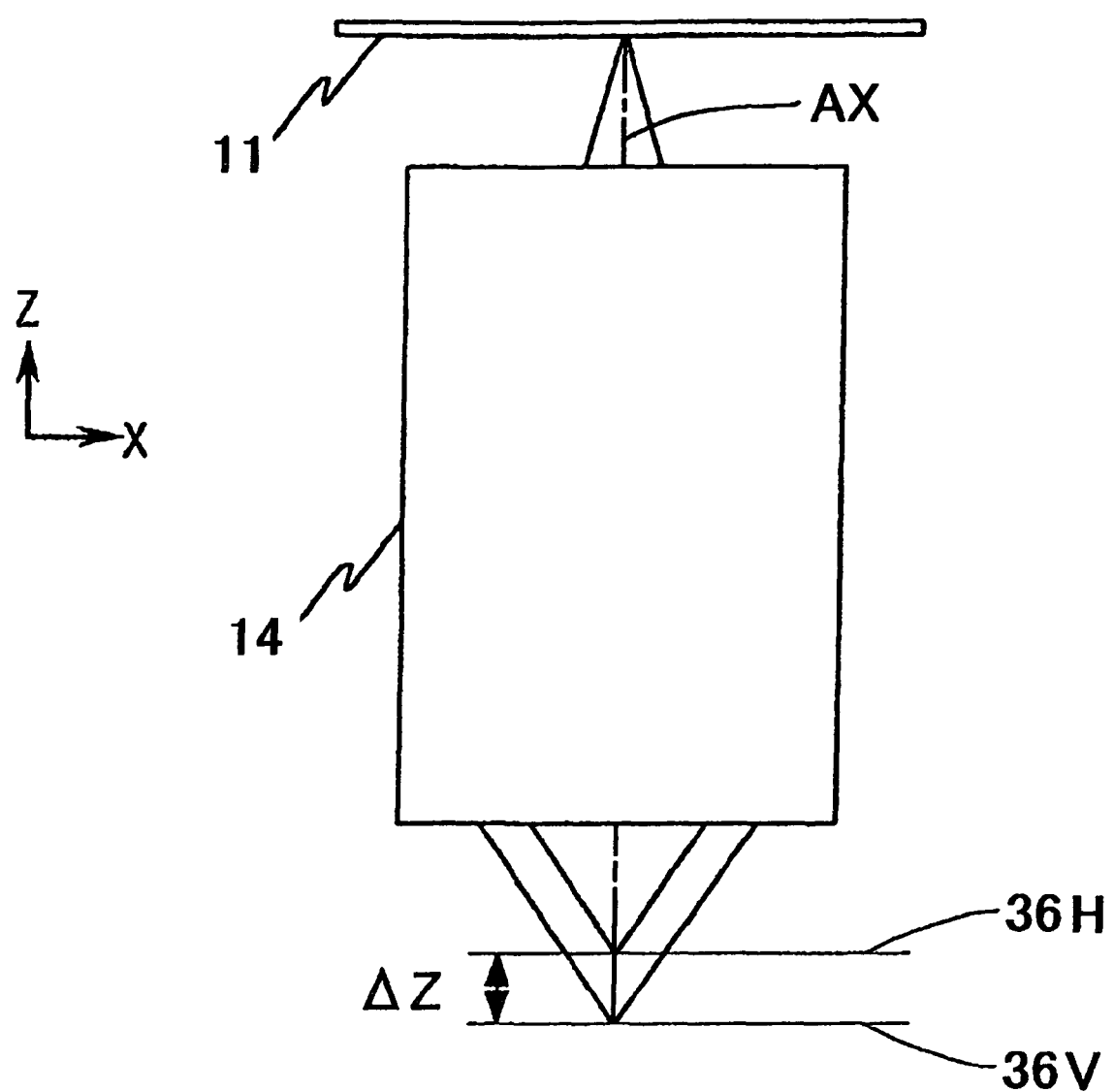
FIG. 9 is an explanatory diagram of an astigmatic aberration of a projection optical system 14.

In this state, light quantity distribution of exposure light IL which inters the lens 32 in the vicinity of the pupil plane PP of the projection optical system 14 shown in FIG. 1 becomes substantially equal to a light quantity distribution shown in FIG. 3B. Therefore, if exposure is continued, a temperature distribution of the lens 32 in the vicinity of the pupil plane PP becomes highest in the two circular regions 34A which sandwich the optical axis in the X direction as shown in FIG. 5, the temperature distribution gradually becomes lower toward the peripheral region 34B, and the lens 32 is thermally expanded (thermally deformed) in accordance with this temperature distribution. In this case, FIGS. 7 and 8 are side views showing variation of the lens 32 in Y direction and X direction in an exaggerated manner. In FIGS. 7 and 8, if a surface shape of the lens 32 before exposure light is absorbed is defined as a surface A, a thermally expanded surface B after exposure light is absorbed is formed with two projections sandwiching the optical axis over a wide range in a direction (FIG. 7) along the X axis. Thus, a refraction force is lowered, a central portion is formed with one projection locally in a direction along the Y direction (FIG. 8) and thus, the refraction force is increased. Thus, as shown in FIG. 9, since the refraction force is reduced with respect to the ray bundle which is opened in the X direction, the image plane of the projection optical system 14 becomes a lower image 36V, and the refraction force is increased with respect to the ray bundle which is opened in the Y direction, the image plane of the projection optical system 14 becomes an upper image plane 36H. Therefore, a center astigmatism ΔZ, which is an astigmatic aberration on the optical axis, is generated.

Figure 10:
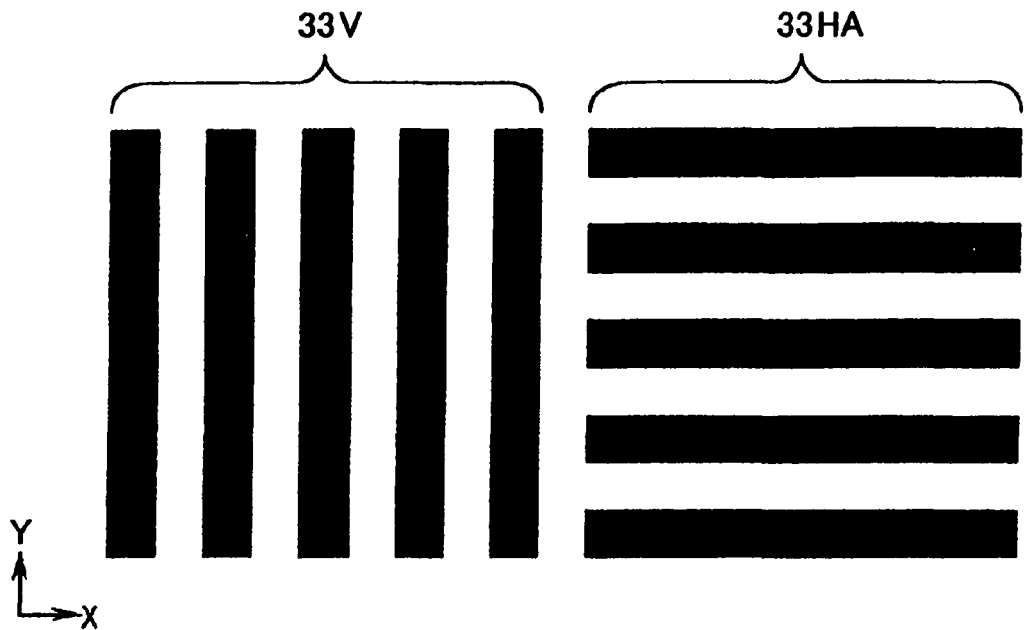
FIG. 10 is an enlarged plan view showing one example of the L&S patterns in the X direction and Y direction which are mixed on a reticle.

In this state, as shown in FIG. 10, if L&S patterns 33HA arranged in the Y direction are formed on the reticle 11 at a predetermined pitch (this pitch is usually greater than that of the L&S patterns 33V) in addition to the L&S patterns 33V, exposure light which passed through the L&S patterns 33V arranged in the X direction spread in the X direction, and exposure light which passed through the L&S patterns 33HA arranged in the Y direction spread in the Y direction. Thus, the images of the L&S patterns 33V in the X direction are formed on the lower image plane 36V, and images of the L&S patterns 33HA in the Y direction are formed on an upper image plane 36H. Therefore, a wafer face is incorporated in the image plane 36V, the images of the L&S patterns 33V in the X direction are transferred at high resolution, but blur is generated in the image of the L&S patterns 33HA in the Y direction due to defocus.

Figure 13:
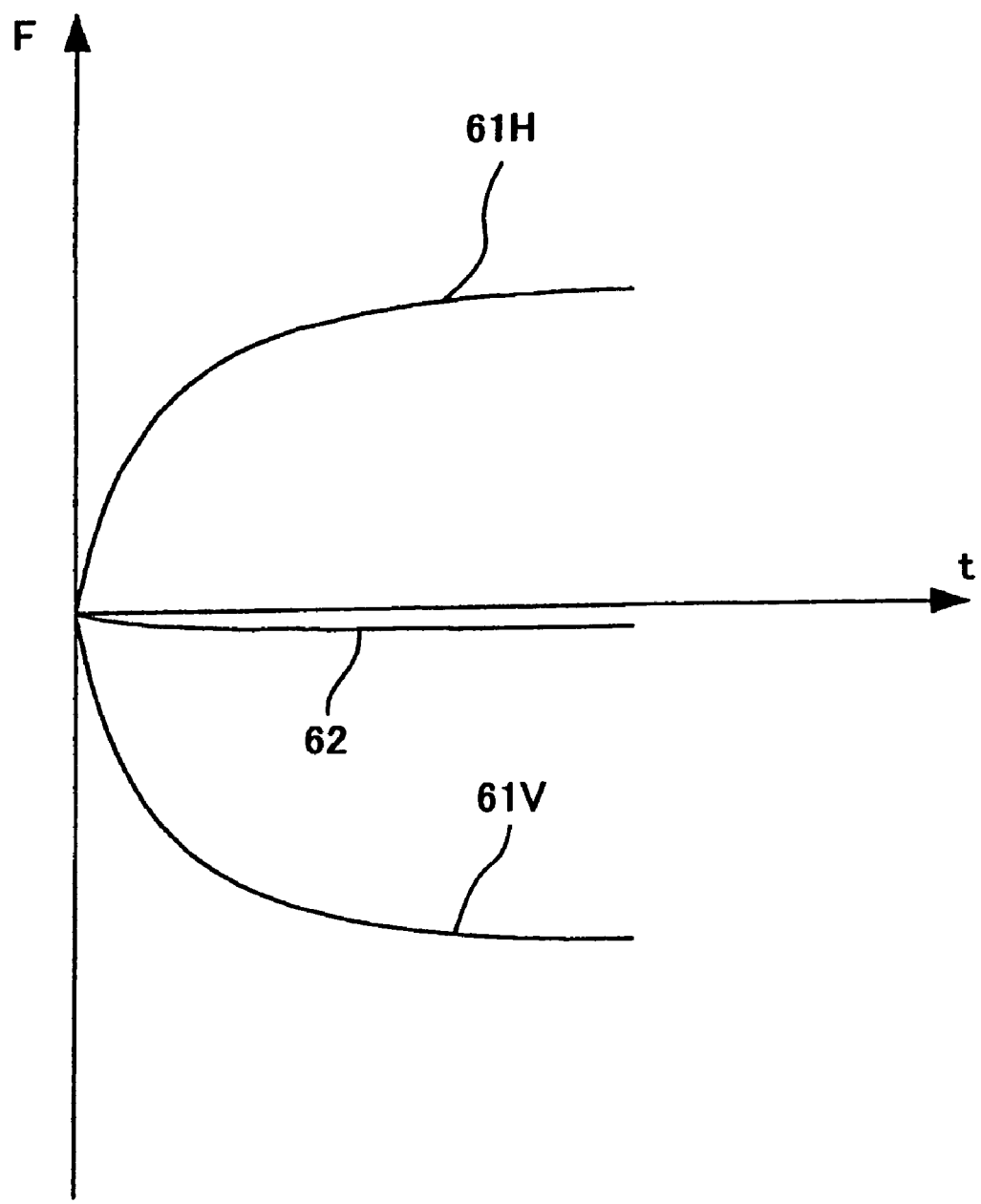
FIG. 13 is a diagram showing one example of variation with time of the astigmatic aberration at the time of dipole illumination in the X direction.

FIG. 13 shows a position (focus position) F of an image plane of the projection optical system 14 on the optical axis which is varied with time by the dipole illumination in the X direction of FIG. 3B. In FIG. 13, a lateral axis shows an irradiation time t of the exposure light IL, and a vertical axis shows a focus position F in the Z direction as measured from a focus position (best focus position) when the irradiation time t is 0. In FIG. 13, a gradually lowering curve 61V shows variation in the focus position F when the L&S patterns 33V in the X direction shown in FIG. 10 are projected, a gradually increasing curve 61H shows variation in the focus position F when the L&S patterns 33HA in the Y direction shown in FIG. 10 are projected, and an intermediate curve 62 shows variation in the focus position F obtained by averaging the two curves 61V and 61H. As can be found from FIG. 13, the variation in focus position F is gradually saturated together with the irradiation time t. This is because that the temperature of the lens 32 is saturated.

On the other hand, as shown in FIG. 4A in an enlarged manner, L&S patterns 33H in the Y direction are formed on the reticle 11. In the L&S patterns 33H, thin and long line patterns are arranged mainly in the X direction at a pitch substantially close to the resolution limit of the projection optical system 14 in the Y direction (scanning direction). In this case, an opening stop 26B having a shape obtained by rotating the opening stop 26A through 90° is set on a pupil plane of the illumination optical system ILS shown in FIG. 1. In the dipole illumination in the Y direction using this opening stop 26B, if there is no reticle, as shown in FIG. 4B, two circular regions 35 which are symmetric in the Y direction with respect to the optical axis AX are illuminated with exposure light IL on the pupil plane PP of the projection optical system 14. At that time, even if various reticle patterns are disposed on the optical path of the exposure light IL, most of exposure light IL (image forming ray bundle) usually passes through the circular region 35 or in the vicinity thereof. If a reticle 11 shown in FIG. 4A is disposed in the optical path of the exposure light IL, ±1st order diffraction light from L&S patterns 33H of pitch close to the resolution limit also pass through the substantially circular region 35 or in the vicinity thereof. Therefore, images of the L&S patterns 33H can be projected on the wafer at high resolution.

Figure 6:
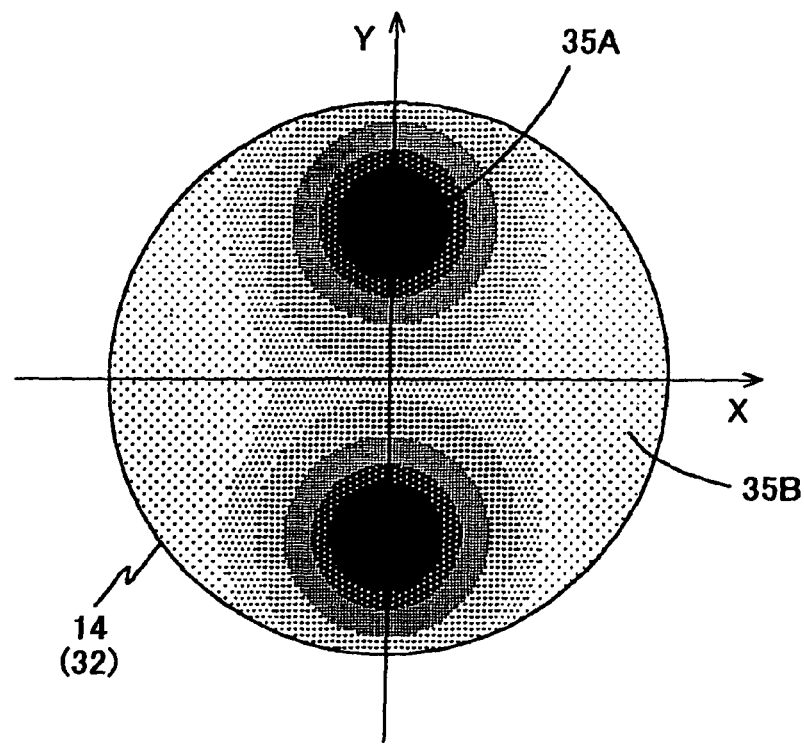
FIG. 6 is a diagram showing a temperature distribution of the lens at the time of dipole illumination in the Y direction.

In this case, light quantity distribution of exposure light IL which inters the lens 32 in the vicinity of the pupil plane PP of the projection optical system 14 shown in FIG. 1 becomes substantially equal to a light quantity distribution shown in FIG. 4B. Therefore, if exposure is continued, a temperature distribution of the lens 32 becomes highest in the two circular regions 35A which sandwich the optical axis in the X direction as shown in FIG. 6, the temperature distribution gradually becomes lower toward the peripheral region 35B, and the lens 32 is thermally expanded in accordance with this temperature distribution. Thus, substrate in the opposite manner as that of the case shown in FIG. 9, since the refraction force is increased with respect to the ray bundle which is opened in the X direction, the image plane of the projection optical system 14 comes close to the upper image plane 36H, and the refraction force is lowered with respect to the ray bundle which is opened in the Y direction, the image plane of the projection optical system 14 comes close to the lower image plane 36V, and an astigmatic aberration having opposite symbol and substrate the same magnitude as those in the case shown in FIG. 9 is generated. In this example, the reticle 11 is illuminated in a rectangular illumination region in which the X direction (non-scanning direction) corresponds to the longitudinal direction of the reticle 11. Thus, an astigmatic aberration caused by the illumination region is also always generated slightly with the same symbol as that of the astigmatic aberration in FIG. 9. On the other hand, an astigmatic aberration generated in the dipole illumination in FIG. 4B has a symbol opposite from that of an astigmatic aberration caused by the rectangular illumination region, and the astigmatic aberration as a whole is slightly smaller than a case in which the dipole illumination shown in FIG. 3B is used.

These astigmatic aberrations are non-rotationally symmetric aberrations, and generate other non-rotationally symmetric aberration (such as difference in magnitude in the X direction and Y direction) due to the dipole illumination, but these non-rotationally symmetric aberrations can not materially corrected by the image forming characteristic correcting mechanism 16 shown in FIG. 1. Also when other non-rotationally symmetric illumination conditions are used, a non-rotationally symmetric aberration is generated. When light quantity distribution of exposure light IL on the pupil plane (pupil plane of the projection optical system 14) of the illumination optical system is largely varied in the radial direction like case where σ illumination is carried out in which an illumination σ value which is a ratio the number of openings of the projection optical system 14 and the number of openings of the illumination optical system ILS is reduced to 0.4 or less, there is an adverse possibility that high order rotationally symmetric aberration such as high order spherical aberration that can not be excellently corrected by the image forming characteristic correcting mechanism 16 is generated. Hence, in this example, in order to correct non-rotationally symmetric aberration, or high order rotationally symmetric aberration, or both of them, the lens 32 in the vicinity of the pupil plane PP of the projection optical system 14 is radiated with aberration correcting illumination light (corresponding to second light beam, and described as "non-exposure light", hereinafter) of wavelength range different from that of the exposure light IL (first light beam) A structure of the non-exposure light irradiation mechanism 40 (irradiation mechanism for emitting second light beam) for emitting non-exposure light LB to the lens 32, and correcting operation of aberration will be explained in detail.

[Explanation of Non-Exposure Light Irradiation Mechanism]

In this example, wavelength range in which photoresist applied to the wafer 18 is not exposed almost at all is used as the non-exposure light LB. Thus, infrared light of wavelength of 10.6 μm which is pulse-emitted from a carbon dioxide laser ($CO_2$ laser) is used as the non-exposure light LB. Continuous light may be used as the $CO_2$ laser. Infrared light of wavelength of 10.6 μm has high absorbency of quartz, and almost all infrared light (preferably 90% or more) is absorbed by one lens in the projection optical system 14. Therefore, there is a merit that the infrared light can easily be used for controlling an aberration without affecting the other lens. Non-exposure light LB directed to the lens 32 of this example is set such that 90% or more of non-exposure light LB is absorbed, and a desired portion of the lens 32 can efficiently be heated. As the non-exposure light LB, it is possible to use near-infrared light having wavelength of about 1 μm emitted from solid laser beam such as YAG laser, or infrared light having wavelength of some μm emitted from a semiconductor laser. That is, as a light source which generates the non-exposure light LB, it is possible to employ an optimal source in accordance with material of the optical member (such as lens) radiated with the non-exposure light LB.

Although the lens 32 is illustrated as the convex lens in FIG. 2 and the like, the lens 32 may be a concave lens.

In the non-exposure light irradiation mechanism 40 shown in FIG. 1, non-exposure light LB emitted from the light source system 41 is branched off into a plurality of (eight) optical paths and one optical path extending toward a photoelectric sensor 43 by a mirror optical system 42. A detection signal corresponding to the light quantity of non-exposure light LB detected by the photoelectric sensor 43 is fed back to a light source system 41. Non-exposure light LB of two of the optical paths of the plurality of optical paths are directed to the lens 32 as non-exposure light LBA and LBB through two irradiation mechanisms 44A and 44B disposed such as to sandwich the projection optical system 14 in the X direction.

Figure 11:
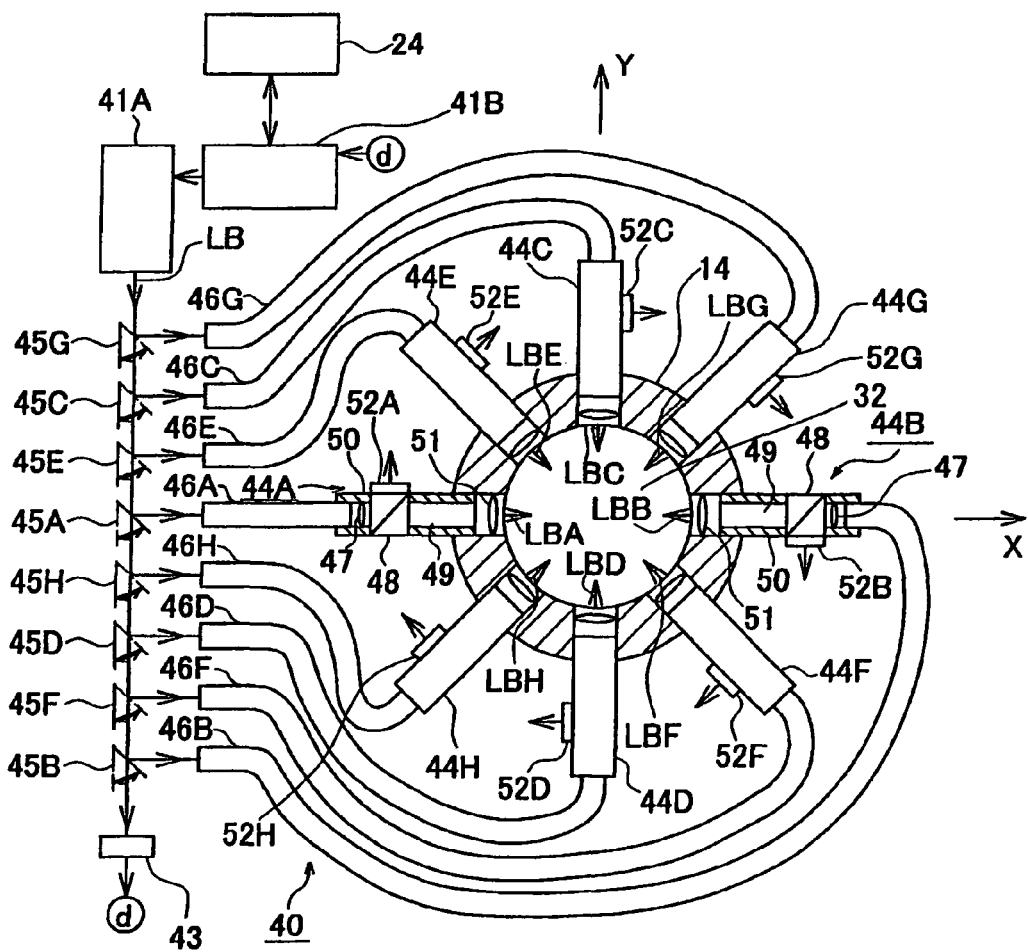
FIG. 11 is a partially cutaway plan view showing an example of a structure of a non-exposure light irradiation mechanism 40 shown in FIG. 1.

FIG. 11 shows a detailed structure of the non-exposure light irradiation mechanism 40. In FIG. 11, the light source system 41 shown in FIG. 1 comprises a light source 41A and a controller 41B. The non-exposure light LB emitted from the light source 41A enters the photoelectric sensor 43 through galvano mirrors 45G, 45C, 45E, 45A, 45H, 45D, 45F and 45B as movable mirrors, and a detection signal of the photoelectric sensor 43 is supplied to the controller 41B. The galvano mirrors 45G, 45C, 45E, 45A, 45H, 45D, 45F and 45B can switch between a state in which the optical path of the non-exposure light LB is bent at 90° (closed state) and a state in which the non-exposure light LB is allowed to pass as it is (opened state). The galvano mirrors 45A to 45H correspond to the mirror optical system 42 shown in FIG. 1. The controller 41B controls light-emitting timing and output of the light source 41A and opening and closing operations of the galvano mirrors 45A to 45H in accordance with control information from the main control system 24.

Non-exposure light LB whose optical path is sequentially bent by the eight galvano mirrors 45A to 45H is introduced into the irradiation mechanisms 44A to 44H through optical fiber bundles 46A to 46H (or metal pipe can also be used). The eight irradiation mechanisms 44A to 44H have the same structures. Each of the irradiation mechanisms 44A and 44B of the eight irradiation mechanisms 44A to 44H includes a converging lens 47, a beam splitter 48 having a small predetermined reflection factor, a light guide portion 49 comprising an optical fiber bundle or relay lens, a converging lens 51, and a holding frame 50 for fixing the converging lens 47 and the light guide portion 49 to the beam splitter 48. The non-exposure light LB may be spread using a lens having divergence function instead of the converging lens 47. The lens 32 in the projection optical system 14 is irradiated with non-exposure light LB as non-exposure light LBA and LBB from the irradiation mechanisms 44A and 44B, respectively. In this case, the first pair of irradiation mechanisms 44A and 44B and the second pair of irradiation mechanisms 44C and 44D are opposed to each other such as to sandwich the projection optical system 14 in the X direction and Y direction. The third pair of irradiation mechanisms 44E and 44F and the fourth pair of irradiation mechanisms 44G and 44H are disposed at an angle in which the irradiation mechanisms 44A and 44B and the irradiation mechanisms 44C and 44D are rotated in the clockwise direction around the optical axis of the projection optical system 14. The lens 32 in the projection optical system 14 is irradiated with non-exposure light LB from the irradiation mechanisms 44C to 44H as non-exposure light LBC to LBH, respectively.

In this case, regions where the lens 32 is irradiated with the pair of non-exposure light LBA and LBB are symmetric circular regions 34 which sandwich the optical axis AX shown in FIG.) 3B in the X direction, and regions where the lens 32 is irradiated with the pair of non-exposure light LBC and LBD are symmetric circular regions 35 which sandwich the optical axis AX shown in FIG. 4B in the Y direction. Regions where the lens 32 is irradiated with non-exposure light LBE and LBF, and with non-exposure light LBG and LGH are symmetric circular regions 34 shown in FIG. 3B and regions obtained by rotating the symmetric circular regions 35 shown in FIG. 4B through 45° in the clockwise direction around the optical axis AX. The optical members irradiated with the non-exposure light LBA to LBH, and shape and size of the irradiation regions of the non-exposure light LBA to LBH on the optical members are determined by experiment or simulation such that non-rotationally symmetric aberrations are reduced as low as possible. The optical members irradiated with the non-exposure light LBA to LBH, and shape and size of the irradiation regions of the non-exposure light LBA to LBH on the optical members are determined in accordance with aberration to be reduced. In FIG. 11 for example, if positions of the optical members in the irradiation mechanisms 44A to 44H are movable, shape and size of the irradiation regions of the non-exposure light LBA to LBH can be changed. It is also possible to adjust the positions of the irradiation regions of the non-exposure light LBA to LBH by making the irradiation mechanisms 44A to 44H themselves or optical members in the irradiation mechanisms 44A to 44H movable.

There are provided photoelectric sensors 52A to 52H (second photoelectric sensors) which respectively receive partial non-exposure light reflected from beam splitters 48 of the irradiation mechanisms 44A to 44H. Detection signals of the eight photoelectric sensors 52A to 52H are also supplied to the controller 41B. The controller 41B can precisely monitor the light quantity of non-exposure light LBA to LBH immediately before the lens 32 in the projection optical system 14 is irradiated with light from the irradiation mechanisms 44A to 44H by detection signals of the photoelectric sensors 52A to 52H, and based on a result of the monitoring, the controller 41B controls such that the exposure dose of each of the non-exposure light LBA to LBH becomes equal to a value specified by the main control system 24. By measuring the exposure dose of the non-exposure light LB by the photoelectric sensors 52A to 52H immediately before the projection optical system 14, it is possible to precisely monitor the exposure doses of the non-exposure light LBA to LBH directed to the lens 32 without being affected by variation per time of the optical system even if the lengths (optical path lengths) of the optical fiber bundles 46A to 46H are different from each other.

When exposure doses of the non-exposure light LBA to LBH are controlled based on the monitoring results of the photoelectric sensors 52A to 52H, it is preferable that the photoelectric sensors 52A to 52H are calibrated. For example, a temperature distribution of the lens 32 when the lens 32 is irradiated with non-exposure light LBA to LBH is measured, and it is possible to calibrate the photoelectric sensors 52A to 52H such that the temperature distribution becomes equal to a desired distribution. Alternatively, image forming characteristics (aberration) when the lens 32 is irradiated with non-exposure light LBA to LBH is measured, and it is possible to calibrate the photoelectric sensors 52A to 52H such that the image forming characteristics (aberration) becomes equal to desired characteristics. When the photoelectric sensor is to be calibrated, the lens 32 may be irradiated with all of non-exposure light LBA to LBH, or the lens 32 may be irradiated one or some of the non-exposure light LBA to LBH (e.g., non-exposure light LBA and LBB) in accordance with a using condition of the non-exposure light LBA to LBH.

Figure 12A:
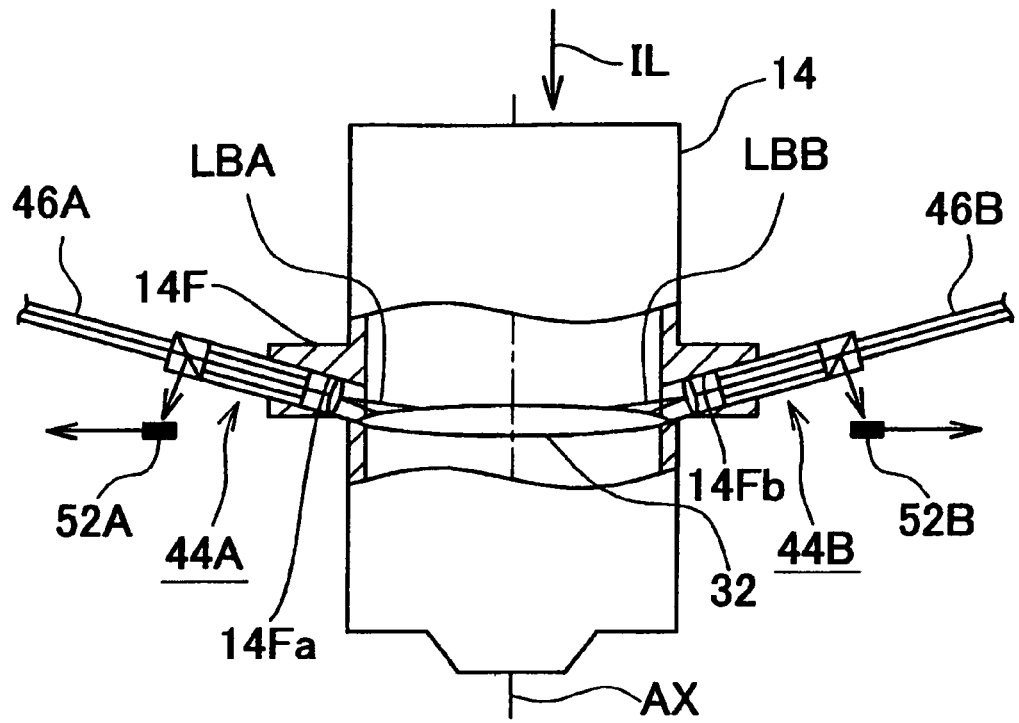
FIG. 12A is a partially cutaway front view showing a structure in the projection optical system (14) of the non-exposure light irradiation mechanism 40 shown in FIG. 11.

FIG. 12A is a partial sectional front view of the projection optical system 14 shown in FIG. 11. As shown in FIG. 12A, the irradiation mechanisms 44A and 44B are disposed in openings 14Fa and 14Fb formed in a flange portion 14F of the projection optical system 14 such that they are slightly downwardly inclined toward the lens 32. Non-exposure light LBA and LBB emitted from the irradiation mechanisms 44A and 44B enter the lens 32 in a direction which obliquely intersects with the optical path of the exposure light IL. Other irradiation mechanisms 44C to 44H shown in FIG. 11 are also disposed in the opening in the flange portion 14F shown in FIG. 12A at the same inclination angle, and the non-exposure light LBC to LBH therefrom also enter the lens 32 in a direction obliquely intersecting with the optical path of the exposure light IL. Since the flange portion 14F is provided with the opening, ejection portions of the irradiation mechanisms 44A to 44H can stably be held in the vicinity of the optical member (lens 32) near the pupil plane of the projection optical system 14 as subject to be irradiated with non-exposure light LB. The non-exposure light LBA to LBH can be directed toward the optical axis of the exposure light IL such as to intersect with the optical path of the exposure light IL, a portion of the optical member (lens 32) of the projection optical system 14 can efficiently be irradiated with light without through other optical member of the projection optical system 14. The lengths of the optical paths for the non-exposure light LBA to LBH in the lens 32 become long, and most of the non-exposure light LBA to LBH is absorbed in the lens 32. Therefore, almost no non-exposure light LB enters other optical members in the projection optical system 14, and non-exposure light LBA to LBH is not ejected from the projection optical system 14 almost at all.

Further, since a lens surface of a portion of the optical member (lens 32) of the projection optical system 14, i.e., a region to which the exposure light IL can enter (or from which the exposure light IL can be ejected) is irradiated with non-exposure light LB, it is possible to adjust the temperature distribution of the lens 32 and the image forming characteristics of the projection optical system 14 more effectively within a shorter time.

Figure 12B:
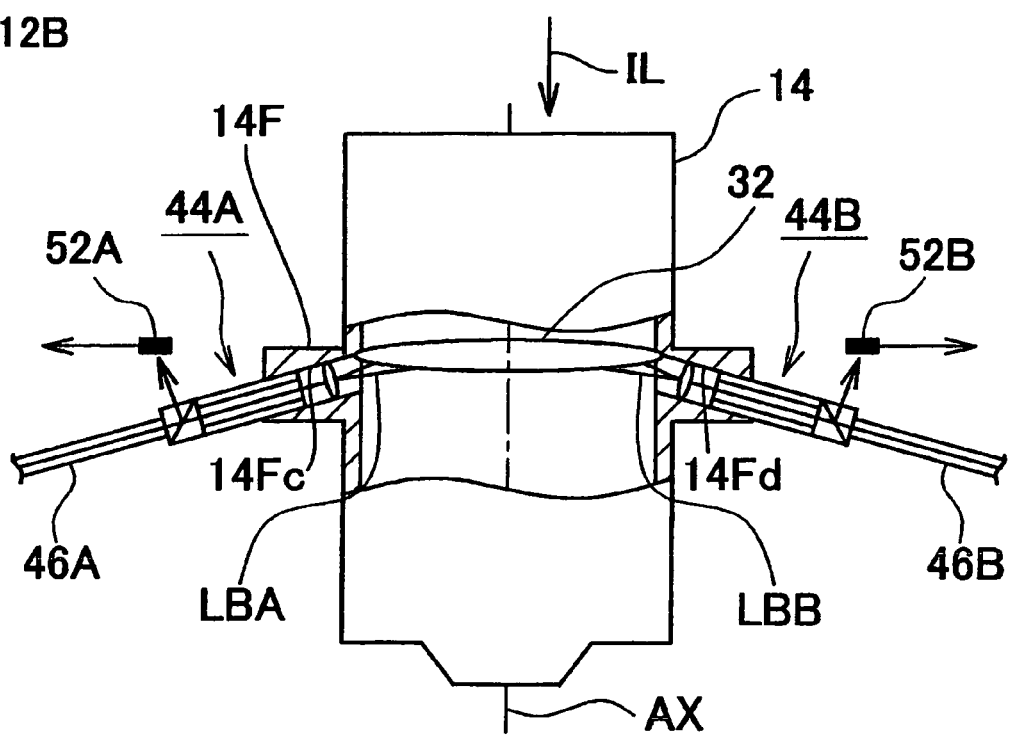
FIG. 12B is a diagram showing a modification of FIG. 12A.

FIG. 12B shows a modification shown in FIG. 12A. As shown in FIG. 12B, the irradiation mechanisms 44A and 44B (the same can be applied to other irradiation mechanisms 44C to 44H also) may be disposed in openings 14Fc and 14Fd formed in the flange portion 14F of the barrel of the projection optical system 14 such that the irradiation mechanisms 44A and 44B are slightly upwardly inclined toward the lens 32, and a bottom surface of the lens 32 may be illuminated with non-exposure light LBA and LBB. In this case, an amount of non-exposure light LBA to LBH leaking from the wafer side of the projection optical system 14 can further be reduced.

Referring to FIG. 11 again, the non-exposure light irradiation mechanism 40 comprises the light source 41A, the controller 41B, the galvano mirrors 45A to 45H, the optical fiber bundles 46A to 46H, the irradiation mechanisms 44A to 44H and the photoelectric sensors 52A to 52H. When the lens 32 is irradiated with only the two non-exposure light LBA and LBB in the X direction, it is only necessary to repeat the following two operations alternately from a state in which all of the galvano mirrors 45A to 45H are opened (state in which non-exposure light LB is allowed to pass), i.e., the operation for closing the galvano mirror 45A for a predetermined time (state in which non-exposure light LB is reflected), and the operation for closing the galvano mirror 45B for a predetermined time. If the galvano mirrors are switched over within a sufficiently short time during which aberration is not affected (e.g., 1 msec), adverse influence on the aberration can be eliminated. Since the non-exposure light LB of this example is pulsed light, the opening and closing operations of the galvano mirrors 45A to 45H may be carried out while using a preset number of pulses as a unit. Similarly, when the lens 32 is irradiated with only two non-exposure light LBC and LBD in the Y direction, an operation for closing the galvano mirror 45C for a predetermined time and an operation for closing the galvano mirror 45D for a predetermined time may be repeated alternately. If the galvano mirrors 45A to 45H are used in this manner, a plurality of locations of the lens surface of the lens 32 can be irradiated with light with desired light quantity efficiently with almost no light quantity loss of non-exposure light LB.

Although the eight regions on the lens 32 can be illuminated with non-exposure light LB in the structure example shown in FIG. 11, most of aberrations generated in normal use can be corrected even if only four regions on the lens 32 in the X direction and Y direction can be illuminated with non-exposure light LB. Further, eight or more regions, e.g., 16 regions may be irradiated with non-exposure light LB. That is, the number and position (number and position of the irradiation mechanisms) of regions irradiated with non-exposure light LB can be determined in accordance with light quantity distribution of exposure light IL in the projection optical system 14, kinds of aberration to be adjusted by the non-exposure light LB or a permissible value of the aberration.

In this embodiment, instead of using the galvano mirrors 45A to 45H, a fixed mirror and a beam splitter may be combined with each other, the non-exposure light LB may be branched into eight ray bundles, and these ray bundles may be opened and closed using shutters. According to this structure, a plurality of locations can be irradiated with non-exposure light LB at the same time. When a carbon dioxide laser or a semiconductor laser is used as the light source for example, light sources as many as necessary irradiation regions (eight in the example shown in FIG. 11) may be prepared, and the irradiation region on the lens 32 may directly be controlled by ON/OFF operation of light emitting operation of light source or using a shutter.

[Irradiation Method of Non-Exposure Light Under Non-Rotationally Symmetric Illumination Condition]

Next, an irradiation method of non-exposure light under a non-rotationally symmetric illumination condition will be explained based on a case in which astigmatic aberration generated during dipole illumination is corrected. Since dipole illumination in the X direction is carried out in this example, two symmetric circular regions 34 with respect to the optical axis AX on the pupil plane PP of the projection optical system 14 are irradiated with exposure light ILLUMINATION LIGHT as shown in FIG. 3B.

Figure 14:
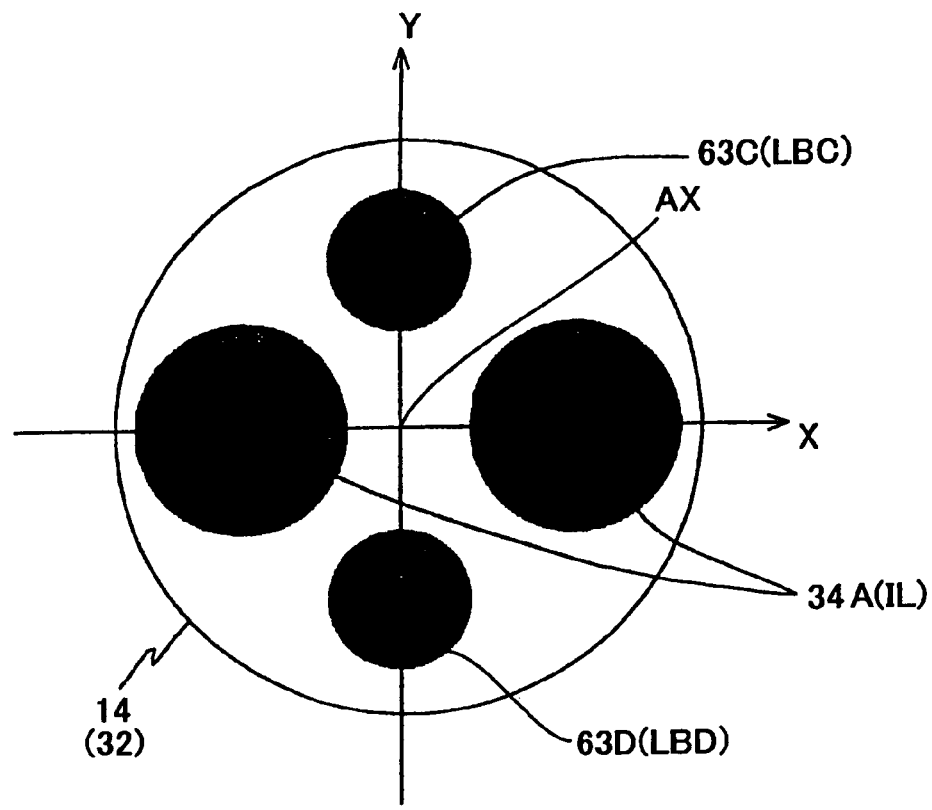
FIG. 14 is a plan view showing an irradiation region of exposure light and non-exposure light with respect to the lens at the time of the dipole illumination in the X direction in one example of the embodiment of the invention.

FIG. 14 is a plan view showing the lens 32 in the vicinity of the pupil plane PP of the projection optical system 14. In FIG. 14, the regions 34A on the lens 32 which are symmetric with respect to the optical axis AX, and regions in the vicinity of the regions 34A are irradiated with exposure light IL. In this example, circular regions 63C and 63D on the lens 32 which are symmetric with respect to the optical axis AX are irradiated with non-exposure light LBC and LBD shown in FIG. 11. Locations of the circular regions 63C and 63D corresponds to positions of the regions 34A rotated around the optical axis AX through 90°. If lenses 51 in the irradiation mechanisms 44C and 44D are made movable in the direction of the optical axis in FIG. 11, shape and size of the irradiation regions of the non-exposure light LBC and LBD (the same can be applied to other non-exposure light) can be changed. The lens 32 may be irradiated with not only the non-exposure light LBC and LBD but also non-exposure light LBE, LBG, LBH and LBF.

Figure 15:
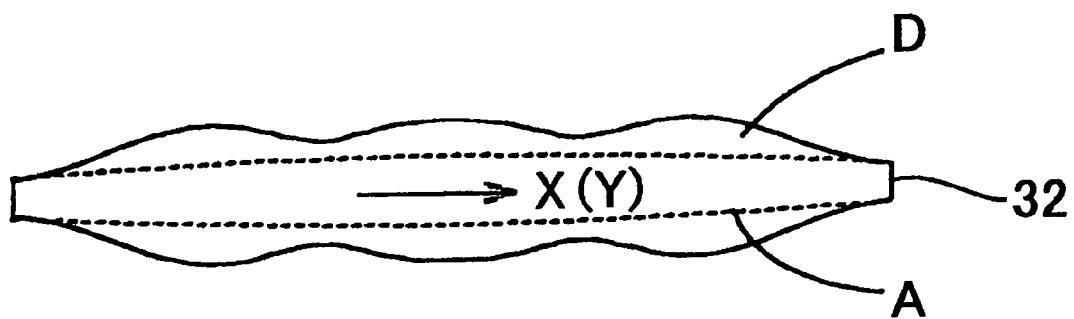
FIG. 15 is a sectional view showing a shape variation caused by temperature rise of the lens shown in FIG. 15.

Regions corresponding to the irradiation regions of the exposure light IL rotated through 90° are irradiated with non-exposure light LBC and LBD. With this, temperature distribution of the lens 32 is increased in the regions 34A and the regions 63C and 63D, and temperature distribution is gradually lowered as separating from these regions. In FIG. 14, if origin points of the X axis and Y axis are defined as the optical axis AX, a sectional view taken along the non-scanning direction in a plane including the optical axis AX and the X axis of the lens 32, and a sectional view taken along the scanning direction in a plane including the optical axis AX and the Y direction are as shown in FIG. 15 in an exaggerated manner. Concerning the thermal expansion of the lens 32, as shown in FIG. 15, a cross section shape of the central portion and left and right portion of the lens 32 are expanded, and a distribution of index of refraction is also largely varied in the central portion and the left and right portions of the lens 32 as compared with other portions thereof. As a result, as compared with the modification shown in FIGS. 7 and 8 in which the lens is illuminated with only exposure light IL, states of deformation of the lens 32 in this example irradiated with exposure light IL and non-exposure light LBC and LBD are similar to each other in the non-scanning direction and scanning direction and thus, focus positions with respect to the ray bundles which open in the X direction and Y direction are substantially equal to each other and almost no astigmatic aberration is generated.

If a lens to be irradiated with non-exposure light is a lens near the pupil plane of the projection optical system 14 which is conjugate with respect to the pupil plane of the illumination optical system ILS like the lens 32 of this example, correcting effect of astigmatic aberration is increased. At that time, a plurality of lenses near the pupil plane may be irradiated with non-exposure light. It is effective if an irradiation region on the optical member to be irradiated to which both exposure light and non-exposure light are directed is as close as rotationally symmetric.

Irrespective of position of an optical member (lens or the like) in the projection optical system 14 which is irradiated with non-exposure light, if the exposure dose is controlled, correction effect of astigmatic aberration in substantially desired range can be obtained. If the region is irradiated with non-exposure light together with exposure light as in this example, non-rotationally symmetric aberration other than astigmatic aberration is reduced.

Even if location of irradiation of non-exposure light, irradiation area, exposure dose, irradiation angle and the like are adjusted, there may be a case in which astigmatic aberration can not be reduced completely (to a normal error range). In this case also, in FIG. 13, curves 61V and 61H showing variation in focus position with respect to L&S pattern in the X direction and Y direction are gently varied and an interval therebetween becomes narrower. Therefore, a wafer face is set to a focus position expressed by a curve 61V, a curve 61H, or a curve 62 obtained by averaging the curves 61V and 6H, depending upon whether a pattern on a reticle which should be mainly transferred is an L&S pattern in the X direction, an L&S pattern in the Y direction, or a pattern in which the L&S pattern in the X direction and the L&S pattern in the Y direction are mixed, respectively. With this, adverse influence of defocus after exposure can be reduced.

Figure 16:
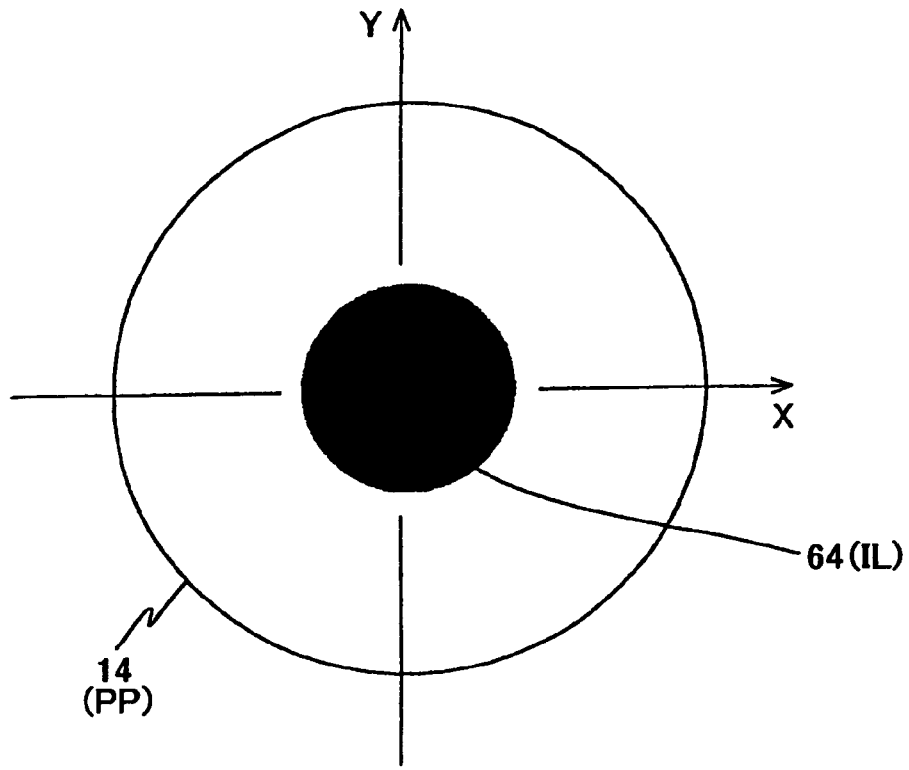
FIG. 16 is a diagram showing one example of a light quantity distribution on the pupil plane of the projection optical system at the time of small σ illumination.

In addition to a case in which a non-rotationally symmetric aberration generated by non-rotationally symmetric illumination like dipole illumination is corrected, also when high order rotationally symmetric aberration such as high order spherical aberration is generated when exposure is carried out under an illumination condition in which light quantity distribution is locally largely varied in the radial direction on the pupil plane of the projection optical system 14, it is possible to reduce the high order rotationally symmetric aberration by emitting non-exposure light as in this example. As one example, when a illumination is carried out, as shown in FIG. 16, in the pupil plane PP of the projection optical system 14, since exposure light IL passes through a small circular region 64 including optical axis and in the vicinity thereof, the light quantity distribution is largely varied in the radial direction. In this case, the lens 32 in the vicinity of pupil plane PP is irradiated with non-exposure light LBA and LBB in the X direction and non-exposure light LBC and LBD in the Y direction using the non-exposure light irradiation mechanism 40.

Figure 17:
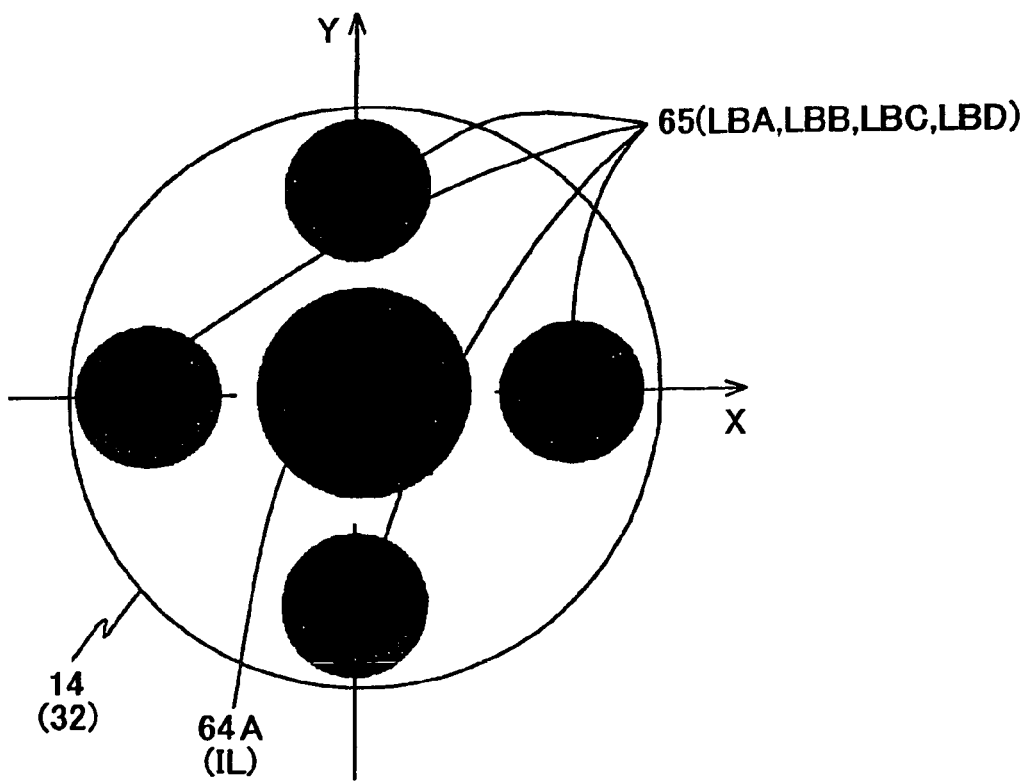
FIG. 17 is a plan view showing irradiation regions of exposure light and non-exposure light with respect to the lens at the time of small σ illumination in one example of an embodiment of the invention.

FIG. 17 shows irradiation regions on the lens 32 in such a case. In FIG. 17, a circular region 64A including the optical axis is irradiated with exposure light IL, and two circular regions surrounding the circular region 64A in the X direction and two circular regions surrounding the circular region 64A in the Y direction are irradiated with non-exposure light LBA, LBB, LBC and LBD. As a result, variation in light quantity distribution in the radial direction of the irradiation energy on the lens 32 becomes gentle (variation in further entire lens surface), and deformation in the radial direction or variation in index of refraction becomes gentle. Therefore, a high order rotationally symmetric aberration becomes a lower order rotationally symmetric aberration (e.g., focus variation or magnification error), and high order rotationally symmetric aberrations are reduced. A newly generated low order rotationally symmetric aberration can easily be corrected by the image forming characteristic correcting mechanism 16 shown in FIG. 1. In this case, the lens 32 may be irradiated with not only non-exposure light LBA, LBB, LBC, LBD but also non-exposure light LBE, LBF, LBG, LBH, and high order rotationally symmetric aberrations may be reduced.

[Irradiation Method of Non-Exposure Light when Non-Rotationally Symmetric Illumination Region is Used]

Next, in FIG. 1, when only a pattern of an end of the reticle 11 in the −X direction is to be exposed, of the original opening 8a of the field stop 8, only an end region 66 (suppose that an erect image is projected for convenience' sake of explanation) in a direction corresponding to the −X direction is an actual opening for exposure light IL. In this state, only regions (largely non-rotationally symmetric regions) substantially in the −X direction of a lens close to a reticle of the projection optical system 14 and a lens close to a wafer shown in FIG. 1 are irradiated with exposure light IL.

Figure 19:
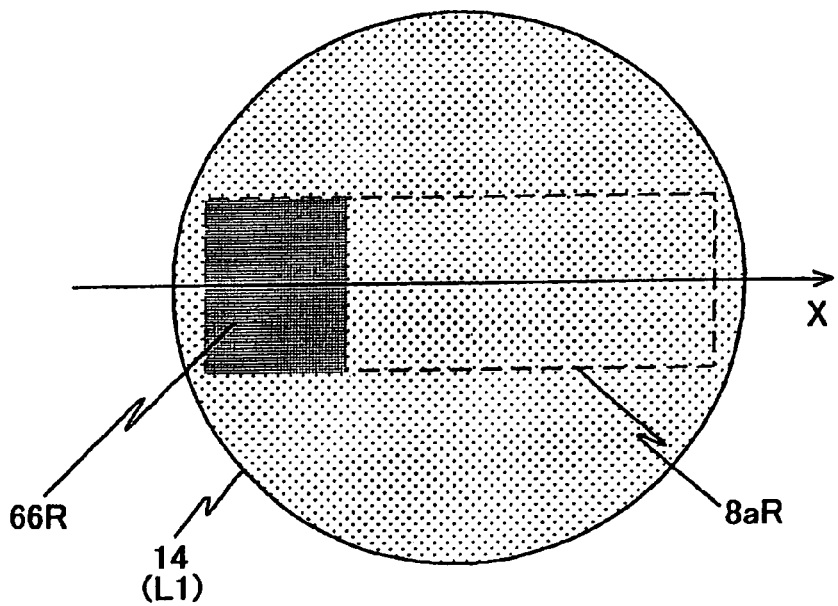
FIG. 19 is a plan view showing an illumination region of exposure light of a lens close to a reticle in the projection optical system when irradiation is carried out using the opening shown in FIG. 18.
Figure 20:
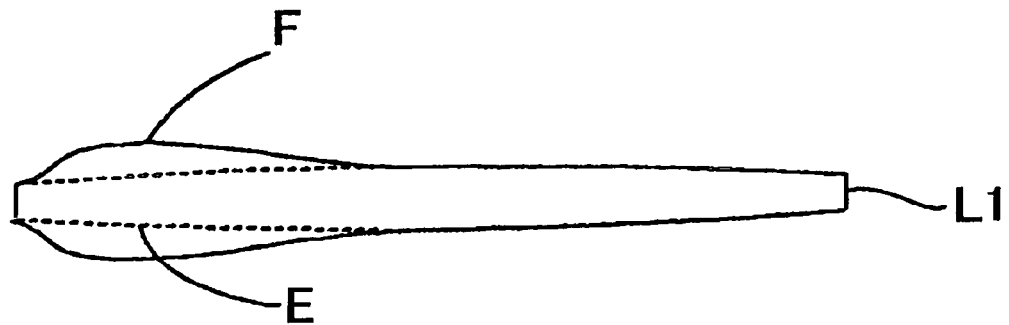
FIG. 20 is a sectional view showing a shape variation caused by temperature rise of the lens shown in FIG. 19.

FIG. 19 shows a lens (lens L1) close to a reticle in the projection optical system 14 of at that time. In FIG. 19, a region 66R at an end of a region 8aR substantially corresponding to an original opening of the field stop 8 is irradiated with exposure light IL locally. If the exposure is continued in this state, as shown in FIG. 20 which is a sectional view taken along the X axis in FIG. 19, the shape of the lens L1 thermally expands into an asymmetric surface F along the X direction with respect to a surface E before exposure. With this expansion, a non-rotationally symmetric aberration is adversely generated. To avoid this, in this example, a region which is not irradiated with exposure light IL in the lens L1 is irradiated with non-exposure light, thereby bringing irradiation energy with respect to the lens L1 close to a rotationally symmetric distribution.

Figure 21:
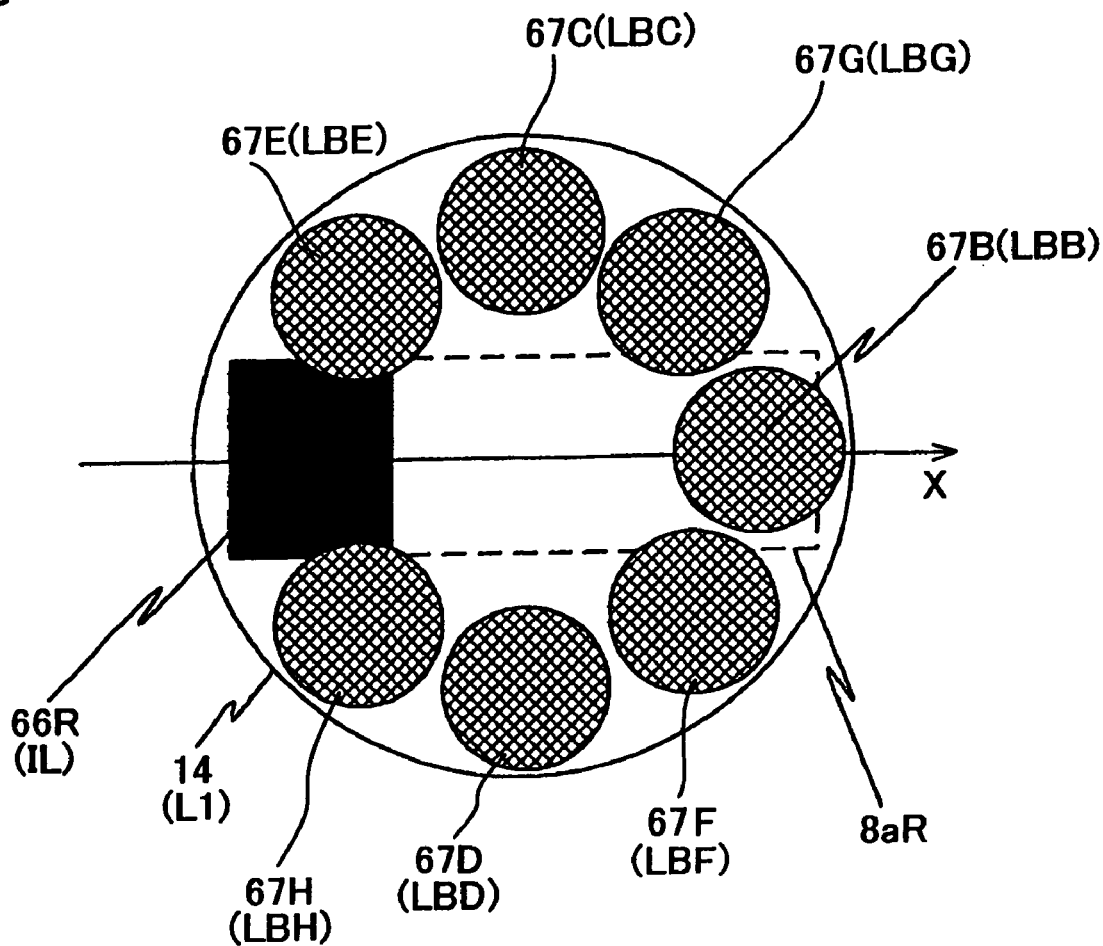
FIG. 21 is a plan view showing an irradiation region of non-exposure light on a lens when illumination is carried out using the opening shown in FIG. 18 in one example of an embodiment of the invention.
Figure 22:
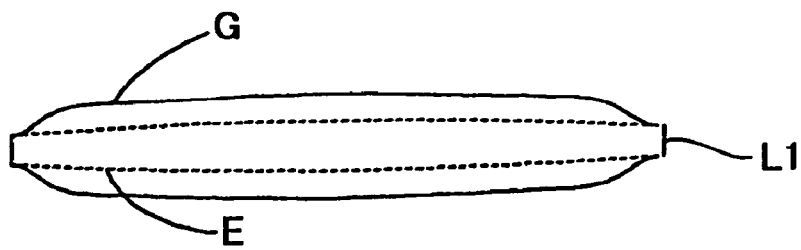
FIG. 22 is a sectional view showing a shape variation caused by temperature rise of the lens shown in FIG. 21.

FIG. 21 shows a case in which the lens L1 is irradiated with non-exposure light using the same irradiation mechanism as the non-exposure light irradiation mechanism 40 shown in FIG. 11. In FIG. 21, the region 66R at an end of the lens L1 in the −X direction is irradiated with exposure light IL. Seven regions 67E, 67C, 67G, 67B, 67F, 67D, 67H forming a rotationally symmetric ring-like region together with the region 66R are irradiated with non-exposure light LBE, LBC, LBG, LBB, LBF, LBD, LBH, respectively. With this, the lens L1 is illuminated with the exposure light IL and non-exposure light LBB to LBH at substantially rotationally symmetric light quantity distribution. Therefore, the lens L1 is deformed rotationally symmetrically as shown with a surface G after deformation in FIG. 22 which is a sectional view taken along the X axis (also Y direction) in FIG. 21. Therefore, the non-rotationally symmetric aberration generated in the state shown in FIG. 20 becomes a rotationally symmetric aberration, and the non-rotationally symmetric aberrations are reduced.

Such non-rotationally symmetric thermal expansion caused by the non-rotationally symmetric opening of the field stop is taken place in an optical member (lens or the like) close to a reticle in the projection optical system 14 and an optical member closer to a wafer. Therefore, effective is increased if an optical member close to a reticle or wafer, or an optical member close to both a reticle and a wafer is irradiated with non-exposure light. Further, when the original opening of the field stop 8 is of rectangular shape, a slightly non-rotationally symmetric aberration is generated. In this case, in FIG. 21, a substantially rectangular region 8aR on the lens L1 is illuminated with exposure light IL. Thus, if two regions 67C and 67D which are symmetric with respect to the region 8aR in a direction of a short side are irradiated with non-exposure light LBC and LBD, a distribution of incident energy with respect to the lens L1 comes close to non-rotationally symmetric. Therefore, non-rotationally symmetric aberrations are reduced. That is, according to the main control system 24, an optimal optical member (such as lens 1) in the projection optical system 14 can be irradiated with at least a portion of non-exposure light LBA to LBH in accordance with setting of the field stop 8. In this case also, position, shape and size of the irradiation region of non-exposure light LBA to LBH are determined such that non-rotationally symmetric aberrations are reduced as much as possible by experiment or simulation, or such that non-rotationally symmetric aberration is not generated.

Also when a predetermined lens in the projection optical system 14 is thermally expanded non-rotationally symmetrically due to difference in pattern existence ratio (density distribution) of the reticle 11, non-rotationally symmetric aberrations can be reduced by emitting non-exposure light such that incident energy is brought close to rotationally symmetric distribution like the case in which the shape of the opening of the field stop 8 is non-rotationally symmetric. Also when a predetermined lens assumes non-rotationally symmetric thermal distribution due to diffraction light by a pattern on the reticle 11, non-rotationally symmetric aberrations can be reduced by the same method. That is, according to the main control system 24, an optimal optical member in the projection optical system 14 can be irradiated with at least a portion of non-exposure light LBA to LBH in accordance with characteristics of the pattern of the reticle 11 such as a pattern distribution, existence or absence of phase shift patter, and existence or absence of contact hole pattern. In this case also, an optical member irradiated with non-exposure light, position, shape and size of the irradiation region of non-exposure light are determined such that non-rotationally symmetric aberrations are reduced as much as possible by experiment or simulation, or such that non-rotationally symmetric aberration is not generated.

[Control Method (1) of Exposure Dose of Non-Exposure Light]

Next, one example of the control method of exposure dose of non-exposure light LB will be explained with reference to a flowchart shown in FIG. 23. This example is base on a case in which when dipole illumination in the X direction shown in FIG. 3B is carried out, the lens 32 in the projection optical system 14 is irradiated with non-exposure light LB from the non-exposure light irradiation mechanism 40 shown in FIG. 11, and astigmatic aberration as non-rotationally symmetric aberration is corrected. First, exposure dose of non-exposure light LB can be determined in the following manner.

Figure 23:
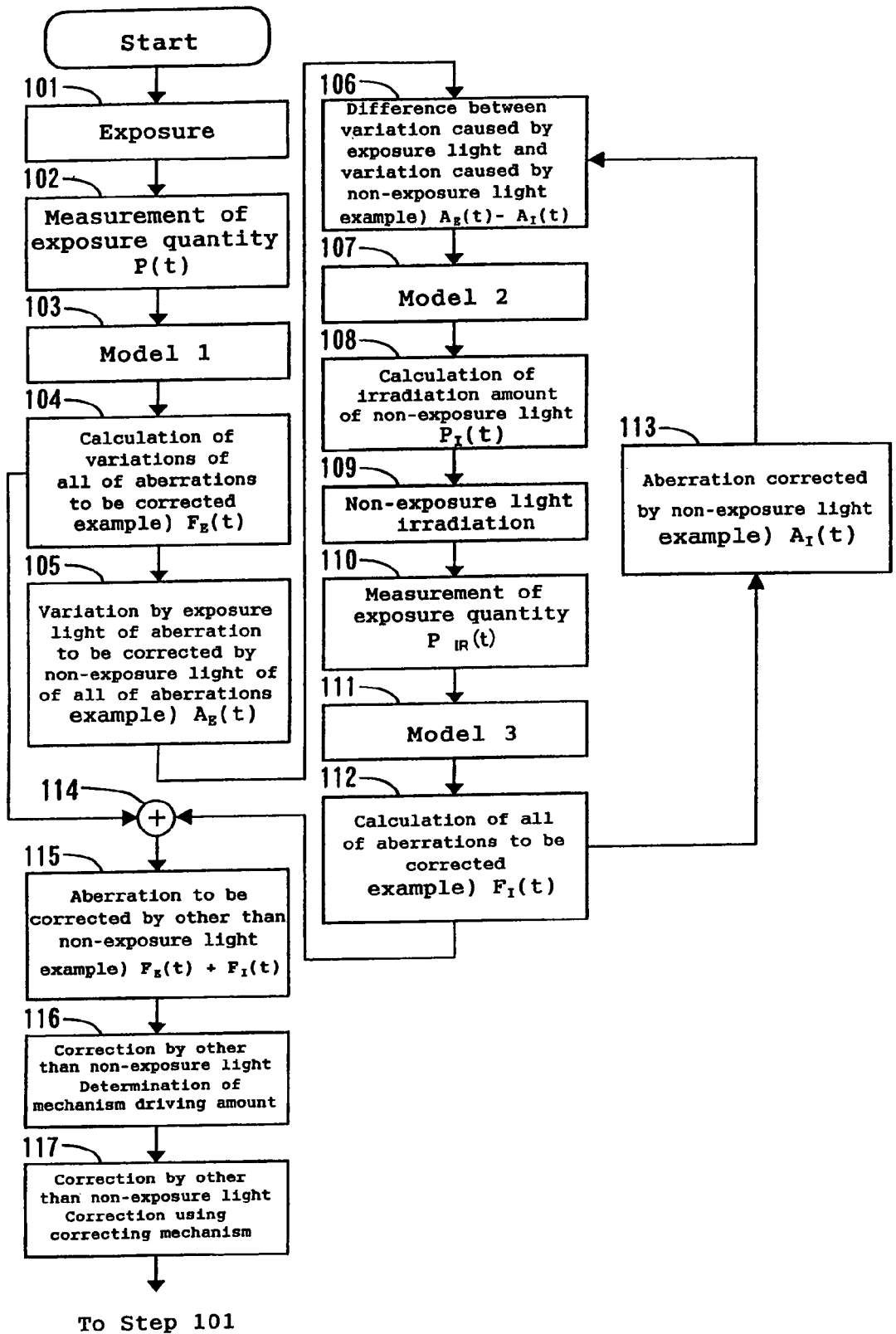
FIG. 23 is a flowchart showing one example of illumination operation of non-exposure light in one example of an embodiment of the invention.

In step 101 in FIG. 23, exposure is carried out by the projection exposing apparatus shown in FIG. 1. In step 102, exposure dose $P_E(t)$ of the exposure light IL from time (t−At) to current time t is measured through the integrator sensor 6 and the reflection amount sensor 7, and the measured data is taken into the image forming characteristic calculator in the main control system 24. This embodiment is based on assumption that also when a polarization state of exposure light IL is variable, exposure dose to the projection optical system 14 of the exposure light IL can precisely be measured. Also when exposure light IL is changed from unpolarized light comprising random component to straight polarized light comprising substantially S polarization component, exposure dose to the projection optical system 14 is precisely measured, and such a value is taken into the main control system 24. A symbol Δt represents an arbitrary sampling interval, and operations from steps 101 to 117 in FIG. 23 are repeatedly executed every sampling interval Δt. For example, Δt is 10 to 0.01 sec. For convenience' sake of explanation, the exposure dose $P_E(t)$ is expressed as P(t) in step 102. At that time, the image forming characteristic calculator previously obtains a model 1 in which exposure dose $P_E(t)$ of exposure light IL is input and aberration variation (variation amount of astigmatic aberration) is output, and a model 2 in which aberration variation is input and exposure dose of non-exposure light LB is output, and determines exposure dose of non-exposure light LB from aberration variation by the exposure light IL and non-exposure light LB in the following manner. In the following explanation, a variation amount of astigmatic aberration by exposure light IL at time t is defined as $A_E(t)$, and a calculation value of a variation amount of astigmatic aberration by non-exposure light LB is defined as $A_I(t)$.

First, in step 103, the image forming characteristic calculator obtains a calculation value $A_E(t)$ of variation amount of astigmatic aberration by the exposure light IL at time t using the following equation (corresponding to the model 1) in which the exposure dose $P_E(t)$ of the exposure light IL is input.

[Equation 1]

$$A_E(t) = \sum_{n=A,B,C}\left\{A_{En}(t-\Delta t)\times\exp\left(-\frac{\Delta t}{T_{En}}\right)+S_{En}\times P_E(t)\times\left(1-\exp\left(-\frac{\Delta t}{T_{En}}\right)\right)\right\} \quad (1A)$$

Wherein, meanings of the variables are as follows:

Δt: sampling interval (calculation interval) [sec]

$A_E(t)$: astigmatic aberration variation amount [m] by exposure light at time t $A_{En}(t)$: astigmatic aberration variation amount [m] by exposure light at time t (n=A,B,C components=X, Y, Z components)

$T_{En}$: time constant [sec] of astigmatic aberration variation by exposure light (n=A,B,C components)

$S_{En}$: saturated value [m] of astigmatic aberration variation by exposure light (n=A,B,C components)

$P_E(t)$: exposure dose [W] of exposure light from time (t−Δt) to t

In next step 104, the image forming characteristic calculator similarly calculates aberrations to be corrected other than the variation value of astigmatic aberration by exposure light, e.g., focus $F_E(t)$, magnification $M_E(t)$, image plane curve, C-shaped distortion, coma aberration and spherical aberration using the same model as that shown in (1A) equation. In next step 105, from all of aberrations, a variation amount $A_E(t)$ by exposure light IL of aberration (here, astigmatic aberration) to be corrected by irradiation of non-exposure light LB is specified. In next step 106, a difference ($=A_E(t)-A_I(t)$) between the calculated value $A_E(t)$ of the astigmatic aberration variation amount by the exposure light IL and the calculated value A(t) of the astigmatic aberration variation amount by the non-exposure light LB is newly defined as a variation amount of astigmatic aberration to be corrected by non-exposure light LB. Here, A(t) is 0 at the initial stage.

Figure 24:
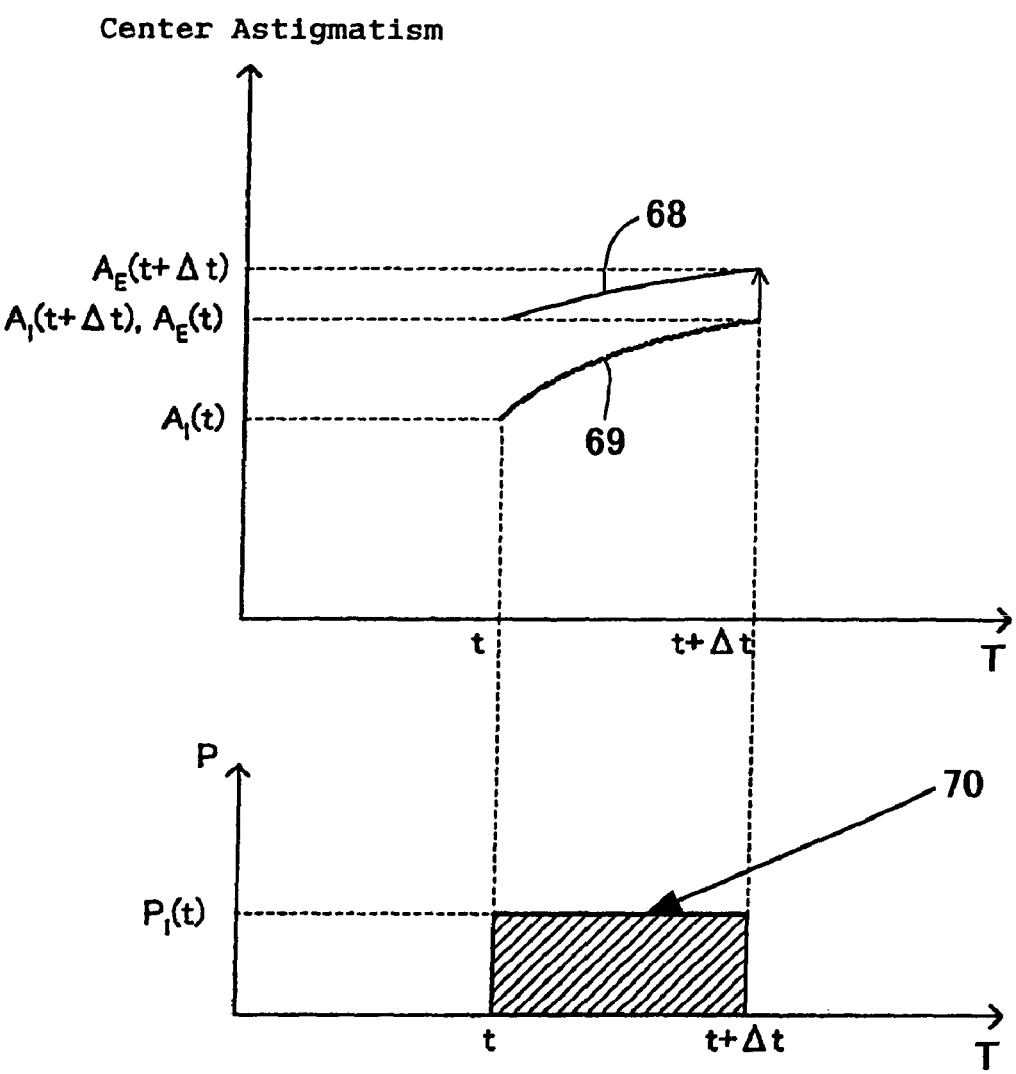
FIG. 24 is a diagram showing one example of astigmatic aberration and variation in exposure dose of non-exposure light.

Next, the image forming characteristic calculator determines exposure dose $P_I(t)$ of non-exposure light LB to be irradiated during a sampling interval Δt after time t such that $A_I(t+\Delta t)$ reaches $A_E(t)$ as shown in FIG. 24. The astigmatic aberration variation amount ($=\Delta A_E(t+\Delta t)-\Delta A_E(t)$) by exposure light IL during Δt is sufficiently small. In FIG. 24, a lateral axis shows elapsed time T after exposure is started, a vertical axis in an upper diagram shows an astigmatic aberration amount, and a vertical axis in a lower diagram shows exposure dose IAPC [W] of non-exposure light LB. A curve 68 in the upper diagram in FIG. 24 shows variation of $A_E(t)$, a curve 69 shows variation of $A_I(t)$, and an hatched area 70 in the lower diagram shows irradiation energy of non-exposure light LB during time t to (t+Δt).

In this case, the following equation is established because of a condition that astigmatic aberration variation amount $A_I(t+\Delta t)$ by non-exposure light LB reaches $A_E(t)$.

[Equation 2]

$$A_I(t+\Delta t) = A_E(t) \qquad (1)$$
$$= \sum_{n=A,B,C}\left\{A_{In}(t)\times\exp\left(-\frac{\Delta t}{T_{In}}\right)+S_{In}\times P_I(t)\times\left(1-\exp\left(-\frac{\Delta t}{T_{In}}\right)\right)\right\}$$

Therefore, exposure dose $P_I(t)$ of non-exposure light LB can be calculated by the following equation (model 2).

[Equation 3]

$$P_I(t) = \frac{A_E(t)-\sum_{n=A,B,C}\left\{A_{In}(t)\times\exp\left(-\frac{\Delta t}{T_{In}}\right)\right\}}{\sum_{n=A,B,C}\left\{S_{In}\times\left(1-\exp\left(-\frac{\Delta t}{T_{In}}\right)\right)\right\}} \qquad (2)$$

If regions (eight regions in this example) irradiated with non-exposure light LB are as m=A1, A2, . . . , and two regions in the Y direction in FIG. 14 are expressed as m=A1 and m=A2, exposure dose $P_{Im}(t)$ (m=A1, A2) of non-exposure light LB in these regions are expressed as follows:

$$P_{IA1}(t)=P_{IA2}(t)=P_I(t)/2 \qquad (3)$$

Wherein, meanings of the variables are as follows:

Δt: sampling interval (calculation interval) [sec]

$A_E(t)$: astigmatic aberration variation amount [m] by exposure light at time t $A_I(t)$: astigmatic aberration variation amount [m] by non-exposure light at time t $A_{In}(t)$: astigmatic aberration variation amount [m] by non-exposure light at time t (n=A,B,C components)

$T_{In}(t)$: time constant of astigmatic aberration variation by non-exposure light (n=A,B,C components)

$S_{In}$: saturated value [m/W] of astigmatic aberration variation by non-exposure light (n=A,B,C components)

$P_I(t)$: non-exposure light exposure dose [W] at time t to t+Δt $P_{Im}(t)$: exposure dose [W] to each region of non-exposure light at time t to t+Δt (m=A1, A2)

Concretely, the image forming characteristic calculator reads out the equation (2) (model 2) in step 107 from a storing section, calculates exposure dose $P_I(t)$ of non-exposure light LB from the equation (2) in step 108, and calculates exposure dose $P_{Im}(t)$ of non-exposure light LB to each region from the equation (3). Calculation results are supplied from the image forming characteristic calculator to the image forming characteristic controller in the main control system 24.

In next step 109, the image forming characteristics controller allows the non-exposure light irradiation mechanism 40 shown in FIG. 11 to irradiate each region of the lens 32 with non-exposure light LB with exposure dose $P_{Im}(t)$ for sampling interval $\Delta t$. In next step 110 (this step is executed in parallel with step 109 in the actual case), the controller 41B in FIG. 11 measures actual exposure dose $P_{IR}(t)$ of non-exposure light LB to each region during the interval $\Delta t$ through the photoelectric sensors 52A to 52H, and supplies the measurement result to the image forming characteristic calculator in the main control system 24. The image forming characteristic calculator calculates (step 112) an aberration variation amount caused by irradiation of non-exposure light LB using (step 111) a model 3 that is the same as an equation (1A) (model 1) from exposure dose $P_{IR}(t)$ of non-exposure light LB. As the exposure dose used for calculating the aberration variation caused by the irradiation of non-exposure light may be any of an average value during interval $\Delta t$ of actually measured exposure dose $P_{IR}(t)$, a representative value during the interval $\Delta t$, and control target value $P_I(t)$ of the exposure dose. When the actually measured exposure dose $P_{IR}(t)$, if the actually measured exposure dose is different from the target exposure dose (exposure dose necessary for correcting the aberration) of non-exposure light LB, such difference is reflected to the target exposure dose and thus, adverse influence on aberration of exposure dose control precision can be reduced. Calculation of the aberration variation caused by non-exposure light LB is carried out with respect to the same aberration as that calculated with exposure light IL. That is, in step 112, the image forming characteristic calculator calculates a variation amount (here, astigmatic aberration variation amount $A_I(t)$) of non-rotationally symmetric aberration to be corrected which is corrected by irradiation of non-exposure light LB, and a variation amount of rotationally symmetric aberration to be corrected generated by irradiation of non-exposure light LB, such as focus $F_I(t)$, magnification $M_I(t)$, image plane curve, C-shaped distortion, coma aberration and spherical aberration.

Then, the image forming characteristic calculator separates (step 113) a variation amount (astigmatic aberration variation amount $A_I(t)$) of non-rotationally symmetric aberration to be corrected which was corrected by irradiation of non-exposure light LB, and uses the astigmatic aberration variation amount $A_I(t)$ when the aberration variation is calculated in step 106. In next step 114, the image forming characteristic calculator adds up variation amounts (focus $F_E(t)$, magnification $M_E(t)$, image plane curve and the like) of rotationally symmetric aberration generated by irradiation of non-exposure light LB which was calculated in step 112, and variation amounts (focus $F_E(t)$, magnification $M_E(t)$, image plane curve and the like) of rotationally symmetric aberration generated by irradiation of exposure light IL calculated in step 104. The focus $F_E(t)$, magnification $M_E(t)$ and the like after the adding operation will be as follows.

$$F(t)=F_E(t)+F_I(t) \quad (4A)$$

$$M(t)=M_E(t)+M_I(t) \quad (4B)$$

In next step 115, of variation amounts of rotationally symmetric aberrations after adding, the image forming characteristic calculator in the main control system 24 supplies, to the image forming characteristics controller, the variation amount of aberration to be corrected using light other than non-exposure light LB, i.e., information of variation amount of aberration (F(t), M(t) and the like) to be corrected using the image forming characteristic correcting mechanism 16. In next step 116, the image forming characteristics controller calculates a driving amount of the image forming characteristic correcting mechanism 16 for correcting the variation amount of the aberration (F(t), M(t) and the like), i.e., in this example, driving amounts of the lenses L1 to L5 shown in FIG. 2 by means of a conventionally known method, and supplies the information of the driving means to the controller 17 shown in FIG. 2. In accordance this, the controller 17 drives the lenses L1 to L5 in step 117, and a rotationally symmetric aberration to be corrected is corrected. At that time, the astigmatic aberration is corrected by irradiation of non-exposure light LB in step 109. Then, the procedure is returned to step 101, and the exposure and aberration correcting operation are repeated until the exposure is completed.

According to this example, a variation amount of a non-rotationally symmetric aberration is calculated based on the measurement value of the exposure dose of exposure light IL during a predetermined sampling interval $\Delta t$, and an exposure dose of non-exposure light LB is set such that a non-rotationally symmetric aberration which cancels out the variation amount is generated. Therefore, it is possible to easily and precisely calculate the exposure dose of non-exposure light LB and as a result, it is possible to extremely reduce the non-rotationally symmetric aberration. The rotationally symmetric aberration generated by irradiation of non-exposure light LB is corrected by the image forming characteristic correcting mechanism 16 together with rotationally symmetric aberration generated by irradiation of exposure light IL. Therefore, the variation amount of aberration is largely reduced, and excellent image forming characteristics are always maintained.

When time constant of a variation of astigmatic aberration caused by irradiation of non-exposure light LB is slower than time constant of a variation of astigmatic aberration caused by irradiation of exposure light IL, it is conceived that the astigmatic aberration is corrected by irradiating a region 34A illuminated with dipole illumination (exposure light IL) in the X direction on the lens 32 shown in FIG. 14 is irradiated with non-exposure light.

[Control Method (2) of Exposure Dose of Non-Exposure Light]

Next, a modification of the control method of an exposure dose of non-exposure light shown in FIG. 23 will be explained with reference to a flowchart shown in FIG. 25. In this example also, exposure is carried out using the same projection exposing apparatus as that shown in FIG. 1 but in this example, the lens 32 irradiated with non-exposure light LB is provided with a temperature sensor (not shown), and actual temperature variation is measured at eight locations on a side surface of the lens 32. As the temperature sensor, it is possible to use a contact type temperature detecting device such as a thermistor, and an infrared light sensor (monitor) which directly measures the temperature of a region irradiated with non-exposure light LBA to LBH in FIG. 11, in non-contact manner, by detecting infrared light.

Figure 25:
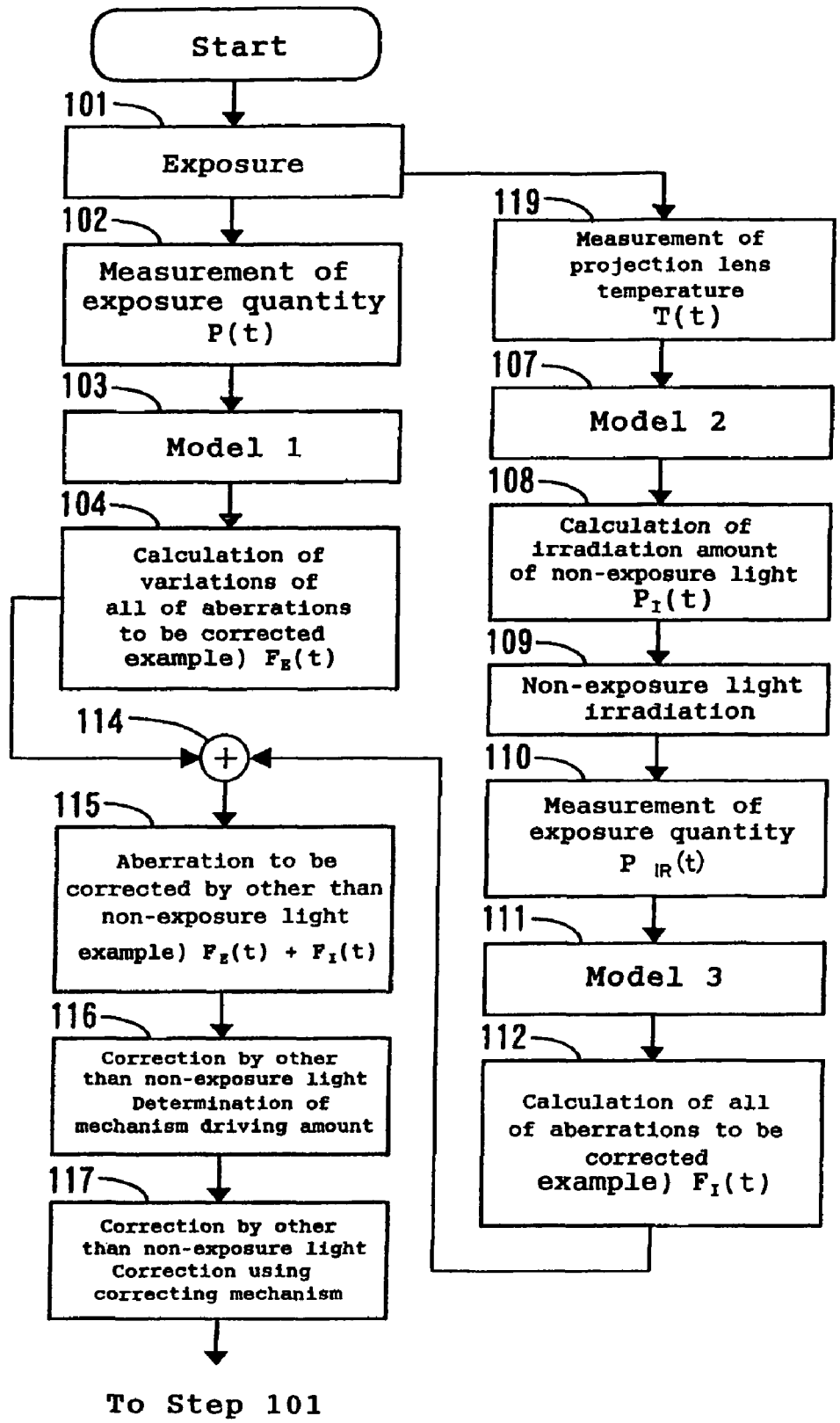
FIG. 25 is a flowchart showing one example of illumination operation of non-exposure light in another example of an embodiment of the invention.

In this modification, after the exposure in step 101 in FIG. 25, the temperature T(t) of the lens 32 in the projection optical system 14 in FIG. 1 is actually measured in step 119 in parallel with operation from measurement of exposure quantity in steps 102 to 104 to the calculation of a variation amount of aberration, and measurement data is supplied to the image forming characteristic calculator in the main control system 24. For example, the temperature T(t) when dipole illumination is carried out is a difference between the temperature of an outer side surface of the region 34A along the X axis of the lens 32 in FIG. 14, and the temperature of outer side surfaces of the regions 63C and 63D along the Y axis. In this case, as input of the temperature T(t) of the lens 32 in the projection optical system 14, a new model 2 in which a variation amount of a non-rotationally symmetric aberration (here, astigmatic aberration) is output is previously obtained, and the image forming characteristic calculator obtains a variation amount of the astigmatic aberration using the new model 2 in step 107 after step 119. In next step 108, the image forming characteristic calculator calculates an exposure dose $P_f(t)$ of non-exposure light LB from the equation (2). Operations of subsequent steps 108 to 112, and steps 114 to 117 subsequent to steps 104 and 112 are the same as those in the example shown in FIG. 23. In the modification shown in FIG. 25, influence of irradiation of exposure light IL and influence of irradiation of non-exposure light LB are included in the temperature T(t) of the lens 32 measured in step 119. Therefore, unlike the example shown in FIG. 23, it is unnecessary to obtain the difference between the aberration variation caused by exposure light calculated in step 105 and the aberration variation caused by non-exposure light calculated in step 113. Therefore, it is possible to correct the non-rotationally symmetric aberration without carrying out complicated calculation.

[Control Method (3) of Exposure Dose of Non-Exposure Light]

Figure 26:
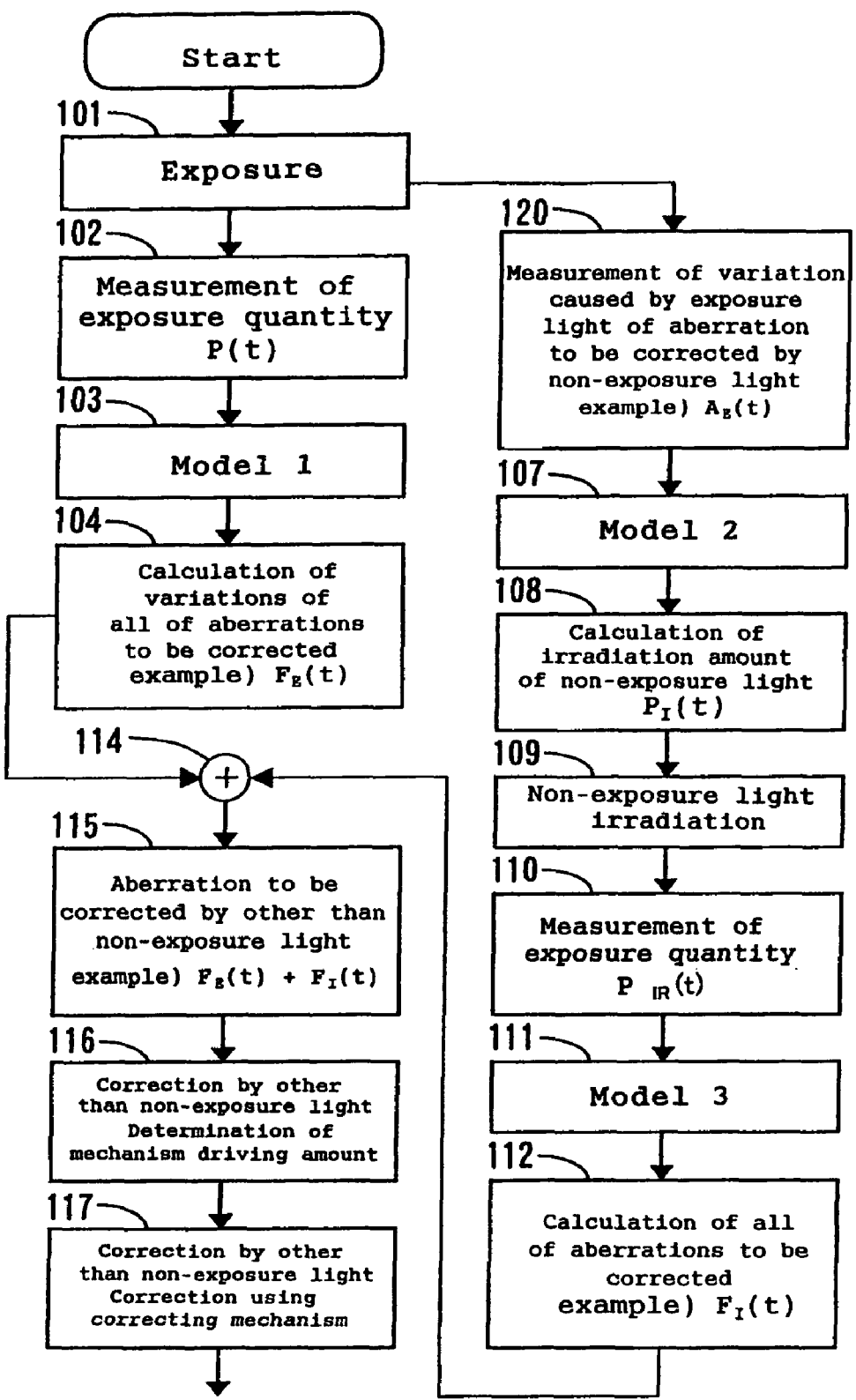
FIG. 26 is a flowchart showing one example of illumination operation of non-exposure light in another example of an embodiment of the invention.

Next, a modification of the control method of an exposure dose of non-exposure light shown in FIG. 25 will be explained with reference to a flowchart in FIG. 26. In this example also, exposure is carried out using substantially the same projection exposing apparatus as that shown in FIG. 1 but in this example, a space image sensor for measuring an image space image of the projection optical system 14 on the Z tilt stage 19 in an image processing mode is provided. In this modification, in FIG. 26, the operation corresponding to step 119 in FIG. 25 is replaced by step 120. In step 120, a variation amount $A_E(t)$ caused by irradiation of exposure light IL of aberration (here, astigmatic aberration) to be corrected by irradiation of non-exposure light LB using the space image sensor is measured. To this end, L&S patterns in the X direction and Y direction may be provided on the reticle 11, the L&S patterns may be moved onto the optical axis AX of the projection optical system 14 in step 120, and focus positions of these projection images may be obtained alternately. In the actual case, it is preferable to measure the aberration variation amount in step 120 at the same time as the exposure in step 101 or at a very slight delay time (e.g., about 1 msec). The model 2 used in step 107 after step 120 is a model in which an actual value of an aberration variation amount is input and an exposure dose of non-exposure light is output. An exposure dose of non-exposure light is determined using this model in step 108. The aberration correcting operation thereafter is the same as that in the example shown in FIG. 25.

As the space image sensor, one disclosed in Japanese Patent Application Laid-open No. 2002-14005 (corresponding U.S. Patent Laid-open No. 2002/0041377) for example. Disclosure thereof is incorporated in this specification under the laws of countries designated or selected in this international application.

According to this modification, since the variation amount of aberration to be corrected is actually measured, the aberration can precisely be corrected by irradiation of non-exposure light.

[Control Method (4) of Exposure Dose of Non-Exposure Light]

According to this control method, an exposure dose of exposure light IL passing through the projection optical system 14 is continuously measured using the integrator sensor 6 and the reflection amount sensor 7 during exposure in FIG. 1. Using the non-exposure light irradiation mechanism 40 in FIG. 11, non-exposure light LB is emitted by the same exposure dose as exposure light IL or by an exposure dose obtained by multiplying a predetermined factor of proportionality. At that time, a factor of proportionality of exposure doses of eight non-exposure light LBA to LBH in FIG. 11 with respect to exposure dose of exposure light IL may be obtained such that a generated non-rotationally symmetric aberration becomes as small as possible. The correcting method of the rotationally symmetric aberration is the same as the above-described control method. Although a non-rotationally symmetric aberration can not completely be corrected according to this control method, it is possible to reduce the aberration, and the control method of exposure dose is simple.

The control methods (1) to (4) of exposure dose of non-exposure light may be used in combination, or one or more of them may be selected in accordance with permissible values of various aberrations and transferring precision of pattern.

[Irradiation Timing of Non-Exposure Light, Calibration, Stop of Emission of Non-Exposure Light]

Examples of possible irradiation timing of non-exposure light are as follows. Here, the exposure dose of non-exposure light is determined by the above-described control method.

(1) Irradiate in accordance with aberration variation.

(2) Irradiate with non-exposure light in synchronism with irradiation of exposure light.

(3) Irradiate with non-exposure light during stepping of wafer stage 20 in FIG. 1.

(4) Irradiate during exchanging operation of wafers.

(5) Irradiate when aberration variation becomes equal to or greater than a threshold value. The aberration variation is compared with the threshold value using an actually measured value or a calculated value.

(6) Irradiate when illumination conditions are switched.

(7) Always irradiate.

When an aberration is to be corrected using a model of an exposure dose of non-exposure light LB and aberration variation, it is conceived that the model is changed due to variation with time of optical fiber, optical system or the like. In such a case, it is possible to obtain a new model by irradiating with non-exposure light and measuring aberration variation at that time. With this, the model can be calibrated.

When an optical system which introduces non-exposure light has a problem and a state in which ales of the projection optical system 14 should have been irradiated with non-exposure light but has not yet been-irradiated is continued for more than a preset time, it is preferable that the main control system 24 (determining apparatus) stops the irradiation of non-exposure light from the light source system 41. For example, when a light quantity detected by at least one of the photoelectric sensors 52A to 52H becomes equal to or smaller than a predetermined amount while irradiating the lens 32 with non-exposure light LBA to LBH, the main control system 24 determines that the optical fiber bundles 46A to 46H are cut or deteriorated, and can stop the irradiation of non-exposure light from the light source system 41. In this case, shutter members may be provided on incident sides of the irradiation mechanisms 44A to 44H to cut out the optical paths of the non-exposure light LBA to LBH.

[When Non-Rotationally Symmetric Aberration Remains]

When non-rotationally symmetric aberration remains due to shortage of exposure dose of non-exposure light or influence of excessively long sampling interval of non-exposure light, a focus position or the like may be controlled such that the aberrations are reduced with a pattern requiring more precise exposure. When astigmatic aberration remains for example, if it is necessary to correct aberration of L&S pattern in the X direction more precisely as compared with L&S pattern in the Y direction, defocus is generated in the L&S pattern in the Y direction by performing control a focus position of a wafer face in accordance with a focus position of an image of the L&S pattern in the X direction, but the image of the L&S pattern in the X direction can be exposed at the best focus position.

[Concerning Non-Rotationally Symmetric Aberration Caused by Factor Other than Irradiation of Exposure Light]

Non-rotationally symmetric aberrations generated due to factors other than irradiation of exposure light such variation of ambient atmospheric pressure and temperature of the projection optical system 14, and adjustment error of the projection optical system 14 can be corrected by determining exposure dose of non-exposure light from remaining aberration. Aberrations caused due to atmospheric pressure variation or temperature variation can be corrected by previously obtaining a mode of these variations and aberration variation. An aberration remaining after the projection optical system 14 is adjusted can be corrected by measuring the aberration and always emitting non-exposure light such as to cancel out the aberration. If it is danger to always emit non-exposure light, the irradiation of non-exposure light may be started when the procedure is shifted to the exposing operation, e.g., during transferring operation of a wafer, and the non-exposure light may be emitted only during the exposing operation.

In the above-described embodiment, at least a portion of the optical fiber bundles 46A to 46H and irradiation mechanisms 44A to 44H is disposed in the vicinity of the projection optical system 14. Therefore, it is preferable that this portion is covered with a heat insulator or the temperature thereof is adjusted by a temperature adjusting mechanism so that the projection optical system 14 is not thermally affected.

Although the above embodiment is based on a case in which mainly the astigmatic aberration is corrected as the non-rotationally symmetric aberration, it is also possible to adjust a non-rotationally symmetric aberration other than the astigmatic aberration such as a magnification difference in the X direction and Y direction and an image shift by irradiating a portion of the optical member of the projection optical system 14 with non-exposure light. In such a case, the optical member to be irradiated with non-exposure light LB is not limited to one located near the pupil plane of the projection optical system 14, and it is preferable select such an optical member that a non-rotationally symmetric aberration to be adjusted can effectively and efficiently be adjusted (corrected).

In order to adjust the non-rotationally symmetric aberration such as the magnification different in the X direction and Y direction, a reticle R may be irradiated with light, and an expansion and contraction state of the reticle R may be adjusted.

In each of the above embodiments, polarization plates may be disposed in the irradiation mechanisms 44A to 44H, and non-exposure light LB directed to a portion of the optical members (lens 32) of the projection optical system 14 may be straight polarized light comprising P-polarization component or S-polarization component. In this case, it is preferable that a portion of the straight separated by the polarization plate to enter the photoelectric sensors 52A to 52H and based on the detection result, the exposure dose of the non-exposure light (straight polarized light) LB is controlled. With this, even if the polarization states of the non-exposure light LBA to LBH are varied by the optical fiber bundles 46A to 46H between the light source system 41 and the irradiation mechanisms 44A to 44H, it is possible to precisely control the non-exposure light (straight polarized light) LB directed to a portion of the optical member (lens 32) of the projection optical system 14. When a straight polarized light is used as the non-exposure light LB, it is preferable to use the straight polarized light comprising P-polarization component. Since the straight polarized light comprising the P-polarization component has low reflection on the incident surface (lens surface of the lens 32), exposure dose of non-exposure light LB directed to a portion of the optical member (lens 32) of the projection optical system 14 can be controlled more precisely. A polarization prism and a polarization filter can be used as the polarization plate. Light of other unused polarization component which is separated by the polarization plate is discharged outside. In this case, it is preferable that the light of other unused polarization component which is separated by the polarization plate is subjected to waste heat processing using a copper pipe so that such light does not thermally affect the projection optical system 14 adversely.

In the above embodiment, a portion of the lens 32 of the projection optical system 14 is irradiated with non-exposure light LB. As the projection optical system 14, it is possible to use a reflection and refraction type projection optical system including a reflection element and a refraction element, and a reflection type projection optical system comprising a reflection element. In this case, it is preferable that non-exposure light LB is directed to a region (effective region) of a portion of the reflection element of the projection optical system where exposure light IL can enter.

When the reflection and refraction type projection optical system is used, if a lens is close to a reticle R or wafer W, since exposure light IL passes through one side locally deviated region, a non-rotationally symmetric aberration (image shift or the like) is prone to be generated, but in this case also, if a portion of the optical member of the projection optical system is irradiated with non-exposure light LB, the non-rotationally symmetric aberration can be adjusted.

A region irradiated with non-exposure light can be expanded or contracted by the optical system, or its shape can be changed by changing the opening shape of the field stop. The optical system of the non-exposure light irradiation mechanism can be made movable. With this, it is possible to accept various illumination conditions (passing region of exposure light near the pupil plane), the opening shape of the field stop, and difference in pattern existence ratio of a reticle.

The projection exposing apparatus of the embodiment can be produced by assembling an illumination optical system and a projection optical system comprising a plurality of lenses into an exposing apparatus body, carrying out optical adjustment, mounting a reticle stage and a wafer stage comprising a large number of mechanical parts on the exposing apparatus body, carrying out wiring and connecting pipes, and by totally adjusting the projection exposing apparatus (electrical adjustment, confirmation of operation and the like). It is preferable to produce the exposing apparatus in a clean room where its temperature and cleaning degree are managed.

When a semiconductor device is to be produced using the projection exposing apparatus of the embodiment, the semiconductor device is produced through the following steps: a step for designing function and performance of the device, a step for producing a reticle based on the former step, a step for forming a wafer of silicon material, a step for carrying out alignment by the projection exposing apparatus of the embodiment to transfer a pattern of a reticle to a wafer, a step for forming a circuit pattern such as etching, a step for assembling the device (including a dicing step, a bonding step and a packaging step), and an inspecting step.

The present invention can be applied not only to a scanning exposing type projection exposing apparatus but also to a case in which exposure is carried out using a collectively exposing type projection exposing apparatus such as a stepper. The invention cal also be applied to an exposing apparatus using a projection optical system including a reflection optical system and a refraction optical system, and to an exposing apparatus which irradiate a wafer with exposure light through liquid such as an immersion exposing apparatus such as one disclosed in International Publication (WO) No. 99/49504. Uses of the exposing apparatus of the present invention are not limited to the exposing apparatus for producing semiconductor devices, and the invention can wide be applied to exposing apparatuses for a display such as a liquid crystal display formed on an angular glass plate and a plasma display, and to exposing apparatuses for producing various devices such as a shooting device (CDD or the like), a micromachine, a thin film magnetic head, and a DNA chip. The invention can also be applied to an exposing apparatus when masks (photomask, reticle and the like) formed with mask patterns for various devices are produced using photolithography.

The present invention is not limited to the above-described embodiments, and can take various structures without departing from a subject matter of the invention of course.

This application claims a priority of Japanese Patent Application No. 2003-209211 filed on Aug. 28, 2003, and contents thereof are herein incorporated by reference.

INDUSTRIAL APPLICABILITY

According to the device producing method of the present invention, since image forming characteristics can always maintained excellently even if a dipole illumination or a small σ illumination is used, a high-density device can be produced with high throughput.

The invention claimed is:

1. An exposure method, comprising:
  illuminating a first object formed with a pattern with a first light beam through an illumination optical system that changes an illumination condition of the first object to expose a second object with the first light beam through the first object and a projection optical system having a first optical member of which a first portion is irradiated with the first light beam and varies with the change of the illumination condition, and second optical members;
  irradiating a second portion of the first optical member of the projection optical system with a second light beam having a wavelength range different from that of the first light beam without passing through the second optical members of the projection optical system to correct optical characteristics of the projection optical system; and
  controlling a light quantity of the second light beam on the second portion for the correction of the optical characteristics by detecting the second light beam before the second light beam is incident on the second portion,
  wherein a position of the second portion is changed based on the first portion varying with the change of the illumination condition by the illumination optical system.

2. An exposure method as recited in claim 1, wherein the second light beam is applied such that a non-rotationally symmetric aberration of the projection optical system generated by the illumination of the first light beam is corrected.

3. An exposure method as recited in claim 2, wherein the first optical member is provided in the vicinity of a pupil plane of the projection optical system.

4. An exposure method as recited in claim 2, wherein at least one of the second optical members different from the first optical member is illuminated with the first light beam at a non-rotationally symmetric light quantity distribution.

5. An exposure method as recited in claim 2, wherein the non-rotationally symmetric aberration is converted into a rotationally symmetric aberration by the irradiation of the second light beam.

6. An exposure method as recited in claim 5, wherein the rotationally symmetric aberration of the projection optical system generated by the irradiation of the second light beam is corrected.

7. An exposure method as recited in claim 2, wherein the second light beam is applied in accordance with an exposure dose of the first light beam.

8. An exposure method as recited in claim 7, wherein a generation amount of the non-rotationally symmetric aberration based on the exposure dose of the first light beam is calculated, and
the second light beam is applied based on the calculation result.

9. An exposure method as recited in claim 2, wherein the second light beam is applied such as to cancel the non-rotationally symmetric aberration generated by the irradiation of the first light beam.

10. An exposure method as recited in claim 2, wherein the non-rotationally symmetric aberration of the projection optical system is measured, and
the second light beam is applied based on a result of the measurement.

11. An exposure method as recited in claim 2, wherein the second light beam is applied such that the non-rotationally symmetric aberration generated when the illumination condition is changed is canceled out.

12. An exposure method as recited in claim 2, wherein when the non-rotationally symmetric aberration remains even if the second light beam is applied, an exposing condition is adjusted in accordance with an aberration in a direction in which more precision exposure is required.

13. An exposure method as recited in claim 1, wherein the first and second light beams are pulsed light, and the second light beam is applied in synchronism with light emitting timing of the first light beam.

14. An exposure method as recited in claim 1, wherein temperature variation of the projection optical system caused by the illumination of the first light beam is monitored, and
the second light beam is applied based on a result of the monitoring.

15. An exposure method as recited in claim 1, wherein the second light beam is applied such that a non-rotationally symmetric aberration generated by variation in ambient atmospheric pressure or temperature of the projection optical system is canceled out.

16. An exposure method as recited in claim 1, wherein the second light beam is applied such that a static non-rotationally symmetric aberration remained by an adjustment of the projection optical system is canceled out.

17. An exposure method as recited in claim 1, wherein the second light beam is applied such that a non-rotationally symmetric aberration generated by a density distribution of the pattern of the first object is canceled out.

18. An exposure method as recited in claim 1, wherein the irradiation of the second light beam is stopped in a period during which the illumination by the first light beam is not carried out.

19. An exposure method as recited in claim 1, wherein 90% or more energy of the second light beam is absorbed by the first optical member.

20. An exposure method as recited in claim 1, wherein the second light beam is carbon dioxide laser light.

21. An exposure method as recited in claim 1, wherein the first optical member is a lens having an incident surface of which the first portion is irradiated with the first light beam and of which the second portion is irradiated with the second light beam.

22. An exposure method as recited in claim 1, wherein the first optical member is irradiated with a linear polarized beam as the second light beam, and the linear polarized beam is detected to control the irradiation of the first optical member.

23. A device producing method, comprising
transferring a pattern of the first object onto the second object using the exposure method as recited in claim 1; and
processing the second object to produce a device.

24. An exposure method as recited in claim 1, further comprising:
moving at least one of the second optical members to adjust a rotationally symmetric aberration of the projection optical system, wherein
a non-rotationally symmetric aberration of the projection optical system is adjusted by the irradiation of the first optical member with the second light beam.

25. An exposure method as recited in claim 24, wherein the second portion includes a portion of an incident surface of the first optical member different from the first portion of the incident surface irradiated with the first light beam.

26. An exposure apparatus comprising:
an illumination optical system having a shaping optical system which changes an illumination condition of a first object formed with a pattern, that illuminates the first object with a first light beam of which an intensity distribution on a pupil plane of the illumination optical system is variable by the shaping optical system to change the illumination condition;
a projection optical system having a first optical member of which a first portion is irradiated with the first light beam and varies with the change of the illumination condition, and second optical members, that project the illuminated pattern onto a second object;
an irradiation system of which an emitting portion is provided on the projection optical system, and that irradiates a second portion of the first optical member of the projection optical system with a second light beam, via the emitting portion, having a wavelength range different from that of the first light beam without passing through the second optical members of the projection optical system to correct optical characteristics of the projection optical system, the irradiation system including a detector which detects the second light beam before the second light beam is incident on the second portion; and
a control system connected to the irradiation system, the control system controls a light quantity of the second light beam on the second portion for the correction of the optical characteristics based on a result of the detection by the detector,
wherein a position of the second portion is changed based on the first portion varying with the change of the illumination condition.

27. An exposure apparatus as recited in claim 26, wherein the control system corrects a non-rotationally symmetric aberration of the projection optical system generated by the illumination of the first light beam by the irradiation of the first optical member with the second light beam.

28. An exposure apparatus as recited in claim 27, wherein the first optical member is provided in the vicinity of a pupil plane of the projection optical system.

29. An exposure apparatus as recited in claim 27, further comprising:
an aberration correcting system connected to the control system, which corrects a rotationally symmetric aberration of the projection optical system, wherein
the control system controls the irradiation system and the aberration correcting system to correct the aberration of the projection optical system.

30. An exposure apparatus as recited in claim 27, further comprising:
a photoelectric sensor which detects an exposure dose of the first light beam, wherein
the control system controls the light quantity of the second light beam based on a result of the detection by the photoelectric sensor.

31. An exposure apparatus as recited in claim 27, further comprising:
a temperature sensor which measures temperature of the projection optical system, wherein
the control system controls the irradiation system based on a result of the measuring.

32. An exposure apparatus as recited in claim 27, further comprising:
an environment sensor which measures an environment condition including atmospheric pressure and temperature in the surrounding of the projection optical system, wherein
the control system controls the irradiation system based on a result of the measuring.

33. An exposure apparatus as recited in claim 26, further comprising:
a determining system which stops irradiation of the second light beam in a period during which the illumination of the first light beam is not carried out.

34. An exposure apparatus as recited in claim 26, wherein the projection optical system has a barrel to hold the first optical member and the second optical members, and the barrel includes an opening through which the second light beam passes.

35. An exposure apparatus as recited in claim 34, wherein the barrel includes a flange portion which supports the barrel, and the opening is provided in the flange portion or in the vicinity of the flange portion.

36. An exposure apparatus as recited in claim 26, wherein the second light beam is carbon dioxide laser light.

37. An exposure apparatus as recited in claim 26, wherein the first optical member is a lens having an incident surface of which the first portion is irradiated with the first light beam and of which the second portion is irradiated with the second light beam.

38. An exposure apparatus as recited in claim 26, wherein the first optical member is irradiated with a linear polarized beam as the second light beam, and the linear polarized beam is detected to control the irradiation of the first optical member.

39. A device producing method, comprising
transferring a pattern of the first object onto the second object using the exposure apparatus as recited in claim 26, and
processing the second object to produce a device.

40. An exposure apparatus as recited in claim 26, further comprising:
a driving system which moves at least one of the second optical members to adjust a rotationally symmetric aberration of the projection optical system, wherein
a non-rotationally symmetric aberration of the projection optical system is adjusted by the irradiation of the first optical member with the second light beam.

41. An exposure method as recited in claim 40, wherein
the second portion includes a portion of an incident surface of the first optical member different from the first portion of the incident surface irradiated with the first light beam.

* * * * *